US011430873B2

(12) United States Patent
Hafez et al.

(10) Patent No.: US 11,430,873 B2
(45) Date of Patent: Aug. 30, 2022

(54) SELF ALIGNED GATE CONNECTED PLATES FOR GROUP III-NITRIDE DEVICES AND METHODS OF FABRICATION

(71) Applicant: Intel Corporation, Santa Clara, CA (US)

(72) Inventors: Walid Hafez, Portland, OR (US); Han Wui Then, Portland, OR (US); Sansaptak Dasgupta, Hillsboro, OR (US); Marko Radosavljevic, Portland, OR (US); Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 16/147,707

(22) Filed: Sep. 29, 2018

(65) Prior Publication Data

US 2020/0105884 A1 Apr. 2, 2020

(51) Int. Cl.
*H01L 29/40* (2006.01)
*H01L 21/768* (2006.01)
*H01L 29/51* (2006.01)
*H01L 29/49* (2006.01)
*H01L 29/66* (2006.01)
*H01L 29/20* (2006.01)
*H01L 29/778* (2006.01)
*H01L 29/423* (2006.01)

(52) U.S. Cl.
CPC ...... *H01L 29/404* (2013.01); *H01L 21/76832* (2013.01); *H01L 29/2003* (2013.01); *H01L 29/42356* (2013.01); *H01L 29/4966* (2013.01); *H01L 29/518* (2013.01); *H01L 29/66431* (2013.01); *H01L 29/66462* (2013.01); *H01L 29/66545* (2013.01); *H01L 29/778* (2013.01); *H01L 29/7786* (2013.01)

(58) Field of Classification Search
CPC .......... H01L 29/2003; H01L 29/42356; H01L 29/66431; H01L 29/778; H01L 29/66462; H01L 29/7786; H01L 29/404
See application file for complete search history.

(56) References Cited

U.S. PATENT DOCUMENTS

| 2018/0190777 | A1* | 7/2018 | Tomomatsu | ........ | H01L 23/4824 |
| 2020/0066889 | A1* | 2/2020 | Then | .................... | H01L 29/7786 |
| 2020/0212214 | A1* | 7/2020 | Odnoblyudov | ..... | H01L 29/7787 |
| 2021/0367047 | A1* | 11/2021 | Radosavljevic | .. | H01L 29/66462 |

FOREIGN PATENT DOCUMENTS

WO WO-2018063399 A1 * 4/2018 ........... H01L 21/768

* cited by examiner

*Primary Examiner* — Joseph C. Nicely
(74) *Attorney, Agent, or Firm* — Essential Patents Group, LLP

(57) ABSTRACT

A device includes a first Group III-Nitride (III-N) material, a gate electrode above the III-N material, and the gate electrode. The device further includes a tiered field plate, suitable for increasing gate breakdown voltage with minimal parasitics. In the tiered structure, a first plate is on the gate electrode, the first plate having a second sidewall laterally beyond a sidewall of the gate, and above the III-N material by a first distance. A second plate on the first plate has a third sidewall laterally beyond the second sidewall and above the III-N material by a second distance, greater than the first. A source structure and a drain structure are on opposite sides of the gate electrode, where the source and drain structures each include a second III-N material.

20 Claims, 13 Drawing Sheets

SELF ALIGNED GATE CONNECTED PLATES FOR GROUP III-NITRIDE DEVICES AND METHODS OF FABRICATION

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-Nitride (III-N) materials are suitable for integrated circuit applications needing high-frequency and/or high-power FETs. However, transistor functionality may be susceptible to gate dielectric breakdown from high drain to gate voltage (for e.g., above 20V). Controlling gate dielectric breakdown at high voltage is important as transistors are scaled in physical dimensions.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1:
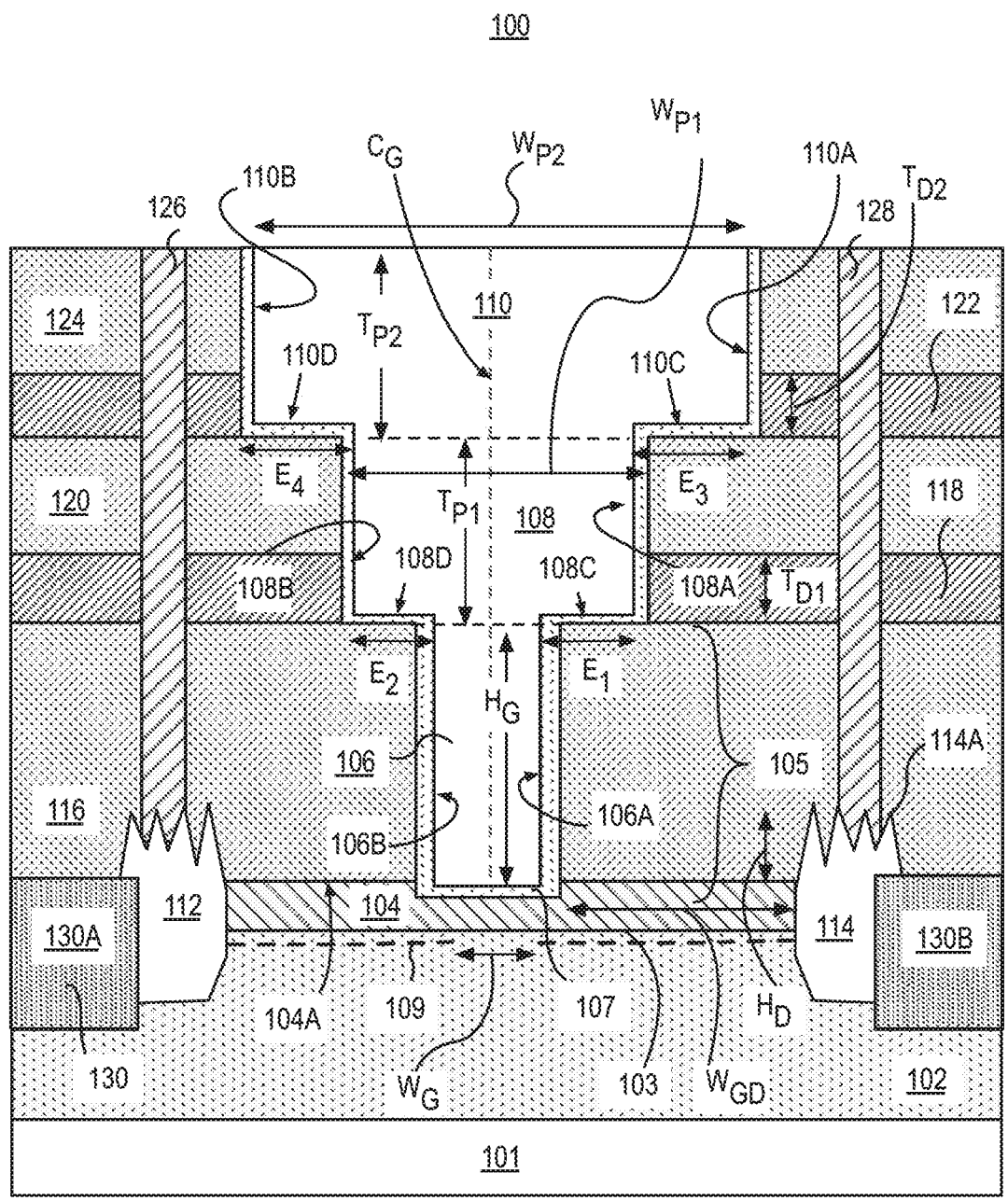
FIG. 1 illustrates a cross-sectional view of a III-N transistor having a gate structure, a first plate on the gate structure and a second plate on the first plate in accordance with embodiments of the present disclosure.

III-N devices with multi-tiered field plates are described herein. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

In the fields of wireless communication and power management, optimizing high frequency response under high drain-to-gate bias voltage in III-N transistors, for example, is highly desirable. A high drain voltage, such as voltages greater than 20V, relative to a gate voltage can create a large electric field in the transistor channel between the gate and the drain. Such a large electric field can cause break down of a gate oxide of a metal-insulator-semiconductor field effect transistor (MISFET). To reduce the electric field at the gate dielectric, a field plate is implemented between a gate and a drain in various III-N transistor configurations. The field plate is a conductive plate having a portion that is physically above a gate and electrically coupled with the gate. A field plate may reduce the electric field at the gate dielectric by depleting charges in a channel region between the gate and drain, in the vicinity of the plate. However, field plates may induce feedback capacitance from drain-to-gate and affect RF behavior. As devices are scaled, the spacing between a gate and drain decreases. A single field plate can incur high parasitic capacitance even though it is easier to fabricate. Thus, having a field plate, which is simultaneously able to increase gate breakdown voltage and improve RF behavior is highly desirable.

In some embodiments described further herein, a transistor structure includes two field plates that are electrically coupled with the gate, and that are laterally tiered. The plates may be arranged such that a first plate includes a portion above the gate and a portion beyond an edge of the gate, and a second plate that includes a portion above the first plate and a portion beyond an edge of the first plate. Such an arrangement of field plates may not only improve gate dielectric breakdown (compared to a single plate) but may also improve RF response in III-N transistors.

In an embodiment of the present disclosure, the two overlapping field plates are stacked directly on each other and directly on a gate structure. The first plate above the gate has a width that is greater than a width of the gate and the second plate has a width that is greater than a width of the first plate. In some examples, the first and second field plates may be symmetric about a vertical axis of the gate electrode. In other examples, the first plate is symmetric about the vertical axis of the gate electrode, but the second plate is asymmetric about a vertical axis of the gate electrode. In yet other examples, portions of the second plate may asymmetrically extend over the drain structure. The two plates and the gate may be coupled by a single metallization structure.

The first field plate proximate to the gate surface may help to deplete the channel nearest the vicinity of the gate. A laterally extended portion of the first plate that is beyond a gate sidewall controls the charge depleted along a finite distance between the gate and the drain. A larger lateral extension may result in greater depletion of charges in the channel. The second plate, which includes a portion overlapping with the first field plate and a portion that extends beyond the first plate can also help to reduce the field, albeit to a lesser extent. The second field plate may behave as a lateral extension of the first field plate, acting to further deplete the channel with a finer level of field control. As the second plate is further (vertically) from the channel than the first field plate its impact on channel depletion will be reduced (because of a lower electric field generated). As such, a lesser amount of charge depletion may result from the second field plate. However, capacitive coupling and parasitic capacitance associated with the second field plate may be less than if the first field plate had similar lateral dimensions. This lower parasitic capacitance may improve a frequency response of the III-N transistor. By designing a width and placement of the first plate relative to the gate, and the width and placement of the second plate relative to the first field plate, increased gate oxide breakdown voltage and improved frequency response may be achieved in a high voltage III-N transistor.

From a practical standpoint aligning two or more stacked field plates to each other and to a transistor gate may present challenges when the separation between the transistor gate and drain is reduced with transistor scaling. In accordance with some embodiments of the present disclosure, fabrication utilizes self-alignment between a transistor gate and one or more field plates. The fabrication techniques may lessen dependence on lithography to determine lateral dimensions of the field plates. More specifically, the fabrication methodology may utilize a sacrificial structure formed above a channel layer between a source structure and a drain structure. A dielectric liner may then be formed on a sidewall of the sacrificial structure and on the underlying dielectric material. Another dielectric material may then be formed around and in contact with the dielectric liner. The sacrificial structure may determine a maximum width of the transistor gate, while a width of the sacrificial structure plus a width or thickness of the dielectric liner determines a maximum width of a first field plate formed on the transistor gate. By selecting a thickness of the liner, the width of the field plates may be modulated. The transistor gate height may be modulating to define how far vertically the field plate is from the channel.

In some embodiments described further below, when the sacrificial structure is removed selectively to the dielectric liner and the second dielectric material, the underlying material may then be etched to form a gate opening above the channel layer. The gate opening defines a location for a gate electrode. The liner may be removed selectively from the adjacent second dielectric material to form a plate opening above the gate opening. The plate opening will have a width that is greater than the gate opening by an amount corresponding to the width of the liner. The openings may then be filled with gate stack material to form a gate and a plate connected to the gate, where the plate has a sidewall that extends beyond a sidewall of the gate electrode.

As also described further below, a second sacrificial structure, a second dielectric liner and a third dielectric material surrounding the second dielectric liner may be formed above the first sacrificial structure to enable formation of a second plate on the first plate. In one such embodiment, the gate opening, as well as the first and second plate openings, may be filled with the gate stack material in a single operation following removal of the sacrificial structures and/or liners.

FIG. 1 illustrates a cross-sectional illustration of a III-N transistor structure 100. The III-N transistor structure 100 includes a channel layer 102 comprising a III-N material. A polarization layer 104 is above the channel layer 102. Both layers 102 and 104 may be collectively referred to herein as "device layers." The polarization layer 104 includes another III-N material that induces a 2-dimensional carrier gas, such as a 2D electron gas (2DEG), as indicated by the dashed lines 103. 2DEG 103 is within channel layer 102 near an interface 109 between the polarization layer 104 and the channel layer 102. The transistor structure 100 further includes a gate electrode 106 on the polarization layer 104. In the illustrative embodiment, the gate electrode 106 is within a recess of the polarization layer 104. The transistor structure 100 further includes a plate 108 on the gate 106 and a plate 110 on the plate 108. A source structure 112 and a drain structure 114 are on opposite sides of the gate electrode 106 as shown. The source structure 112 and the drain structure 114 each include a doped-III-N material.

The plates 108 and plates 110 may each have a different width compared to a width of the gate electrode 106. As shown, the gate electrode 106 has a gate width, $W_G$, within a cross-sectional plane (X-Y) that intersects the source structure 112 and drain structure 114. In some embodiments, the gate electrode 106 has a width, $W_G$, approximately between 10 nm and 100 nm. The plate 108 has a plate width, $W_{P1}$, and the plate 110 has a plate width, $W_{P2}$, as shown. In the illustrative embodiment, $W_{P1}$ is larger than $W_G$, and $W_{P2}$ is greater than $W_{P1}$. While plates 108 and 110 can both be larger in width than the gate electrode 106, they need not be symmetric about a center of the width, $W_G$.

FIG. 1 is an illustrative example where the plates 108 and plates 110 are symmetric about a center, $C_G$, of the gate width, $W_G$, of the gate 106. Plate 108 has a sidewall 108A that is laterally distant beyond a sidewall 106A of the gate electrode 106 by a distance $E_1$. The plate 108 has a sidewall 108B opposite to sidewall 108A that is laterally distant beyond a sidewall 106B of the gate electrode 106, by a distance $E_2$. In the illustrative embodiment, distances $E_1$ and $E_2$ are equivalent or substantially equivalent. $E_1$ and $E_2$ control a lateral extent of a capacitive field created by the plate 108. In an embodiment, $E_1$ and $E_2$ are each between 5 nm and 200 nm. A distance between 5 nm and 200 nm enables the plate 108 to control charge locally in the channel 102, when a bias of least 20V is applied to the drain.

As shown, the plate 110 has a sidewall 110A that is laterally distant beyond the sidewall 108A by a distance $E_3$. The plate 110 has a sidewall 110B opposite to sidewall 110A that extends beyond the sidewall 108B, by a distance $E_4$. In the illustrative embodiment, the distances $E_3$ and $E_4$ are equivalent or substantially equivalent. In an embodiment, $E_3$ and $E_4$ are between 5 nm and 200 nm. A distance between 5 nm and 200 nm lowers a gate resistance and provides an additional degree of freedom to optimize breakdown characteristics. The field generated by the plate 110 prevents the field generated by the plate 108 to concentrate at a distance $E_1$ or $E_2$. The effective field is pushed out further toward the drain, where the effective field has a decreasing magnitude.

A maximum value of distances $E_1$, $E_2$, $E_3$ and $E_4$ are also dependent on a spacing, $W_{GD}$, between gate 106 and drain structure 114. In some embodiments, the gate to drain spacing, $W_{GD}$, is between 500 nm and 1000 nm. In other embodiments, $W_{GD}$, is between 100 nm and 500 nm.

The gate electrode 106 has a height $H_G$, measured relative to a top surface 104A of the polarization layer 104. The height $H_G$ may be between 10 nm and 100 nm, for example. $H_G$ may be chosen based on a height of the drain structure 114 and/or source structure 112, and the spacing desired between a lowermost surface 108C and the channel layer 102. The spacing between the channel layer 102 and the lowermost surfaces 108C, 108D will impact a magnitude of the capacitive field created by the plate 108.

The plate 108 has a thickness $T_{P1}$ that is dependent on the desired plate geometry. In an embodiment, $T_{P1}$ is between 10 nm and 500 nm. In some embodiments, $T_{P1}$ and $H_G$ are chosen so that lowermost surfaces 110C and 110D of the plate 110 are above a level of the top surface 114A of the drain structure 114. The plate 110 has a thickness $T_{P2}$. $T_{P2}$ is between 10 nm and 500 nm. The spacing between the lowermost surfaces 110C and 110D and the channel layer 102 controls a magnitude of the capacitive field created by the plate 110. The capacitive field created by plate 110 is lower than the capacitive field created by plate 108.

The plate 108 and plate 110 are adjacent to one or more layers of dielectric. In the illustrative embodiment, plate 108 is adjacent to a dielectric liner 118 and a dielectric material 120 above the dielectric liner 118. The dielectric liner 118 has a thickness, $T_{D1}$, that may be related to width, $W_{P1}$, of the plate 108 and width, $W_G$, of the gate electrode 106. In the illustrative embodiment, $T_{D1}$, is the same or substantially the same as $E_1$ and $E_2$. In some such embodiment, a combined sum of two times $T_{D1}$, plus the width, $W_G$, of the gate electrode 106 is equal to the width, $W_{P1}$, of the plate 108. This relation is indicative of the fabrication process utilized to form the gate electrode 106 as will be discussed further below.

Plate 110 is adjacent to a dielectric liner 122 and a dielectric material 124 above the dielectric liner 122. The dielectric liner 118 has a thickness, $T_{D2}$. $T_{D2}$ may be related to $E_3$ and $E_4$. Such as, for example, when $W_{P2}$ is greater than $W_{P1}$, as shown, $E_3$ and $E_4$ are at least greater than $T_{D2}$. Such a relation is also indicative of the fabrication process utilized to form the plate 110, plate 108 and the gate electrode 106 as will be discussed further below.

The thickness, $T_{D1}$, of the dielectric liner 118 may also determine a thickness, $T_{P1}$, of the plate 108. In an embodiment, the plate 108 has a maximum thickness, $T_{P1}$, that geometrically approaches the thickness, $T_{D1}$, of the dielectric liner 118. With the fabrication scheme to be described in FIGS. 4A-4O, the plate 108 has a maximum thickness, $T_{P1}$, that geometrically does not exceed the thickness, $T_{D1}$, of the dielectric liner 118.

Similarly, the thickness, $T_{D2}$, of the dielectric liner 122 may also determine a thickness, $T_{P1}$, of the plate 110. In an embodiment, the plate 110 has a maximum thickness, $T_{P2}$, that geometrically approaches the thickness, $T_{D2}$, of the dielectric liner 122. With the fabrication scheme to be described in FIGS. 4A-4O, the plate 110 has a maximum thickness, $T_{P2}$, that geometrically does not exceed the thickness, $T_{D2}$, of the dielectric liner 122.

In an embodiment, the transistor 100 further includes a gate dielectric 107 between the gate electrode 106 and the polarization layer 104, such is shown. In the illustrative embodiment, gate dielectric layer 107 is adjacent to and in contact with the sidewalls 106A and 106B. The gate dielectric layer 107 is also adjacent to and in contact with the sidewalls 108A, 108B, 108C and 108D of the plate 108 as shown. The gate dielectric layer 107 is further adjacent to and in contact with the sidewalls 110A, 110B, 110C and 110D of the plate 110, as shown.

In an embodiment, the gate electrode 106 includes a metal such as, but not limited to, Pt, Ni and an alloy such as TiN or TaN. In some embodiments, the gate electrode 106 further includes a work function metal and a gate cap. The work function metal may include a metal such as Pt, Ni, and an alloy such as TiN or TaN and the gate cap may include a metal, such as W, for example.

In the illustrative embodiment, plate 108 and plate 110 include a same material as the material of the gate electrode 106. The plate 108 and plate 110 may also, for example, include conductive materials that are different from the material of the gate electrode 106. The plate 110 may also, for example, include a conductive material that is different from the material of plate 108. Examples of such conductive material include TiN, TaN, Co or W lined with Ru or Ta.

The gate dielectric layer 106A may have a high relative permittivity (i.e., dielectric constant, or K, exceeding that of silicon nitride). In some high-K gate dielectric embodiments, the gate dielectric layer 106A is a metal oxide (e.g., including oxygen and one or more metals, such as, but not limited to, aluminum, hafnium, zirconium, tantalum or titanium). In another embodiment, the gate dielectric layer 106A includes silicon and at least one of oxygen (e.g., silicon dioxide) or nitride (e.g., silicon nitride). In some examples, the gate dielectric layer 106A has a thickness between 2 nm and 10 nm.

Dielectric liner 118 and/or dielectric liner 122 include any material that has sufficient dielectric strength to provide electrical isolation such as, but not limited to, silicon dioxide, silicon nitride, silicon oxynitride, carbon doped nitride and carbon doped oxide. In an exemplary embodiment, dielectric liner 118 and 122 includes silicon and nitrogen (e.g., silicon nitride).

In an embodiment, the transistor structure 100 further includes a dielectric material 116 adjacent to the gate dielectric layer 107. The dielectric material also extends over the polarization layer and on portions of the source structure 112 and drain structure 114, and isolation 130A and 130B. As shown, portions of the plate 108 are over the dielectric material 116. Dielectric material 116 includes any material that has sufficient dielectric strength to provide electrical isolation such as, but not limited to, silicon dioxide, silicon nitride, silicon oxynitride, carbon doped nitride and carbon doped oxide.

In an embodiment, the transistor structure 100 also includes a dielectric material 120, as shown. The plate 108 is also adjacent to a dielectric material 120, as illustrated. Dielectric material 124 includes any material that has sufficient dielectric strength to provide electrical isolation such as, but not limited to, silicon dioxide, silicon nitride, silicon oxynitride, carbon doped nitride and carbon doped oxide.

In an embodiment, when the plate 108 has a maximum thickness, $T_{P1}$, that is substantially equal to, $T_{D1}$, of the dielectric liner 118, and the plate 110 has a maximum thickness, $T_{P2}$, that is substantially equal to, $T_{D2}$, of the dielectric liner 122, the dielectric material 120 and 124 are not present in transistor structure 100.

In an embodiment, the polarization layer 104 includes a suitable second III-N material. In an embodiment, the polarization layer 104 includes a material such as, but not limited to, $Al_zGa_{1-z}N$, $Al_wIn_{1-w}N$, or AlN, where "Z" ranges from 0.2-0.3 and "W" ranges from 0.7-0.85. One combination includes a polarization layer 104 of AlGaN and a channel layer 102 of GaN. In an embodiment, the polarization layer 104 has a thickness sufficient to introduce a polarization difference in the interface 103 between the channel layer 102 and the polarization layer 104, creating a 2DEG in the vicinity of an uppermost surface of the channel layer 102. Depending on the choice of material, the polarization layer 104 has a thickness between 3 nm and 20 nm. In an exemplary embodiment, the polarization layer 104 is AlInN, a thickness between 3 nm and 10 nm. The presence of the 2DEG may support current conduction in the channel layer 102 between the source structure 112 and the drain structure 114 in the III-N transistor structure 100A. In the illustrative embodiment, by biasing the gate 106 (e.g., positively) relative to the drain contact 114, such current conduction may be modulated (e.g., turned off).

In an embodiment, the channel layer 102 includes a III-N material such as gallium nitride (GaN). In one such embodiment, the channel layer 102 has a relatively high carrier mobility, (greater than 500 cm$^2$ V$^{-1}$). The channel layer 102 may be a substantially un-doped III-Nitride material (e.g., O$_2$ impurity concentration minimized) for minimal impurity scattering. In other embodiments, the channel layer 102 includes one or more ternary alloys of GaN, such as AlGaN, AlInN, or a quaternary alloy of GaN including at least one group III element and nitrogen, such as In$_X$Al$_Y$Ga$_{1-X-Y}$N, where "X" ranges from 0.01-0.1 and "Y" ranges from 0.01-0.1. The channel layer 102 may have thickness between 100 nm and 5 um.

In an embodiment, the source structure 112 and the drain structure 114 include a III-N material that is lattice matched to the channel layer 102. The source structure 112 and the drain structure 114 may for example, include GaN or InGaN. When the source structure 112 and the drain structure 114 include InGaN, the indium level in may be between 1-15 atomic percent of InGaN. In an exemplary embodiment, the source structure 112 and the drain structure 114 include an impurity dopant such as an n-type dopant or an n+ dopant. Examples of an n-type dopant include a material such as Si or Ge. In one embodiment, the n-type dopant material is silicon. As a further example, the silicon n-type dopant may have a n-type dopant density of at least 1e19/cm$^3$. The drain structure 114 has a height, H$_D$, as measured from the polarization layer surface 104A that is between 10 nm and 40 nm.

In the illustrative embodiment, the III-N transistor structure 100 further includes at least one isolation structure 130 for electrical isolation from an adjacent III-N transistor. In the illustrative embodiment, the III-N transistor structure 100 includes isolation structures 130A and 130B adjacent to the source structure 112 and drain structure 114, respectively. The isolation structures 130A and 130B provides electrical isolation between adjacent III-N transistors. The isolation structures 130A and 130B may also provide a buffer region for lateral overgrowth of the source structure 112 and drain structure 114, as illustrated. Isolation structures 130A and 130B include any material that has sufficient dielectric strength to provide electrical isolation such as, but not limited to, silicon dioxide, silicon nitride, silicon oxynitride, carbon doped nitride and carbon doped oxide.

In an embodiment, the substrate 101, includes a semiconductor material such as but not limited to silicon, silicon germanium (Ge) or silicon carbide (SiC). In an exemplary embodiment, the substrate 101 is a silicon substrate having a (100) top surface. A silicon substrate 101 with a (100) top surface enables co-integration of silicon CMOS transistor technology with a III-N material. In a second embodiment, the silicon substrate 101, has a (111) top surface. In embodiments, the channel layer 102 and the substrate 101 have mismatched lattice structures. The lattice mismatch between the channel layer 102 and the substrate 101 may be between 15%-50%.

Figure 2A:
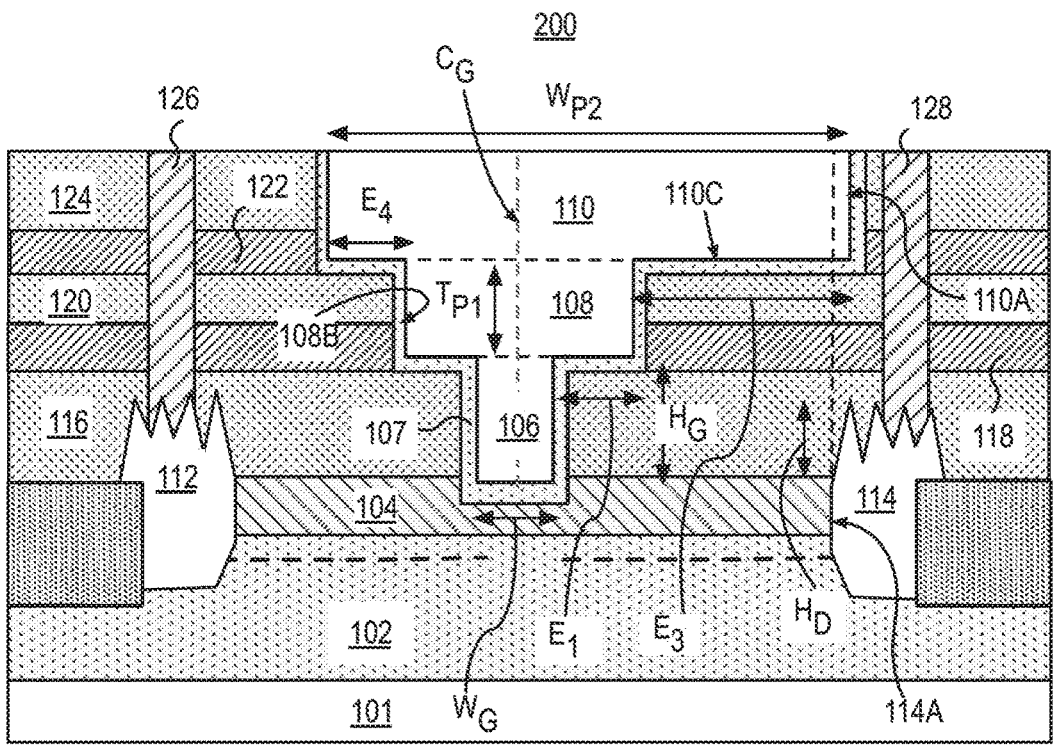
FIG. 2A illustrates a cross-sectional view of a III-N transistor where the second plate extends over a source or a drain of the on the III-N transistor, in accordance with embodiments of the present disclosure.

In some embodiments, when W$_{P1}$ is larger than W$_G$, and W$_{P2}$ is greater than W$_{P1}$, the plate 108 is symmetric about the center, C$_G$, of the gate width, W$_G$, but the plate 110 is asymmetric about the about the center, C$_G$. FIG. 2A is an illustrative example of a transistor structure 200 where the plate 108 is symmetric about the center, C$_G$ and the plate 110 is asymmetric about the center, C$_G$. An asymmetric plate 110 may be advantageous for fine tuning the gate dielectric breakdown at high voltage and enable high RF performance. A relatively lower electric field may be generated during operation of plate 110, compared to plate 108 extending over the same distance. This lower field results in less capacitive coupling because of the larger separation from the channel layer 102. A lower capacitive coupling may improve a high frequency switching response of the IIII-N transistor 200.

In the illustrative embodiment, the sidewall 110A of plate 110 is over the drain structure 114. As shown, the sidewall 110A is over the sidewall 114A of the drain structure 114, adjacent to the polarization layer 104. In some embodiments, the sidewall 110A is over the drain structure 114 by a distance between 5 nm and 50 nm.

In some such embodiments, either the height, H$_G$, of gate electrode 106, or sum of the height, H$_G$ and thickness, T$_{P1}$ of plate 108 is greater than H$_D$ of the drain structure 114 so that the plate 110 is not in contact with the drain structure 114. In the illustrative embodiment, height, H$_G$, of gate electrode 106 is greater than height, H$_D$ of the drain structure 114.

Figure 2B:
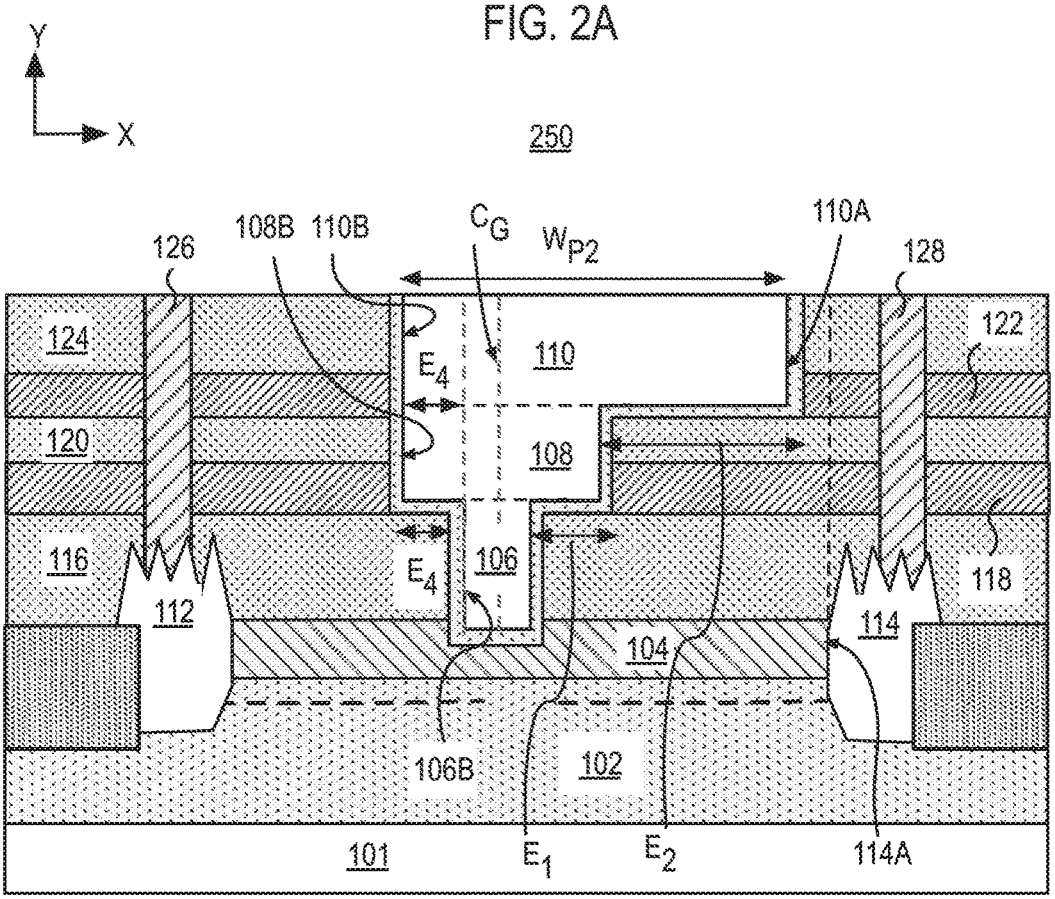
FIG. 2B illustrates a cross-sectional view of a III-N transistor having a gate structure, a first plate on the gate structure and a second plate on the first plate, where a sidewall of the first plate is aligned with a sidewall of the second plate, in accordance with embodiments of the present disclosure.

In other embodiments, when the plate 108 is symmetric about the center, C$_G$, of the gate width, W$_G$, and the plate 110 is asymmetric about the center, C$_G$, the sidewalls 108B and 110B are colinear or substantially colinear as illustrated in FIG. 2B. As shown, both sidewalls 108B and 110B of are laterally beyond the sidewall 106B by a same or substantially the same distance, E4. In the illustrative embodiment, the sidewall 110A is not over the drain structure 114. In other embodiments the sidewall 110A is over the drain structure 114 (not shown). Transistor 250 may be advantageous from a device scaling perspective where a gate to source spacing may be reduced, for example.

Although not illustrated, asymmetrical positioning of field plate 108 is also possible, for example with filed plate 108 positioned closer to the drain structure 114 than to the source 112 substantially as illustrated for field plate 110 in FIGS. 2A and 2B.

Figure 3:
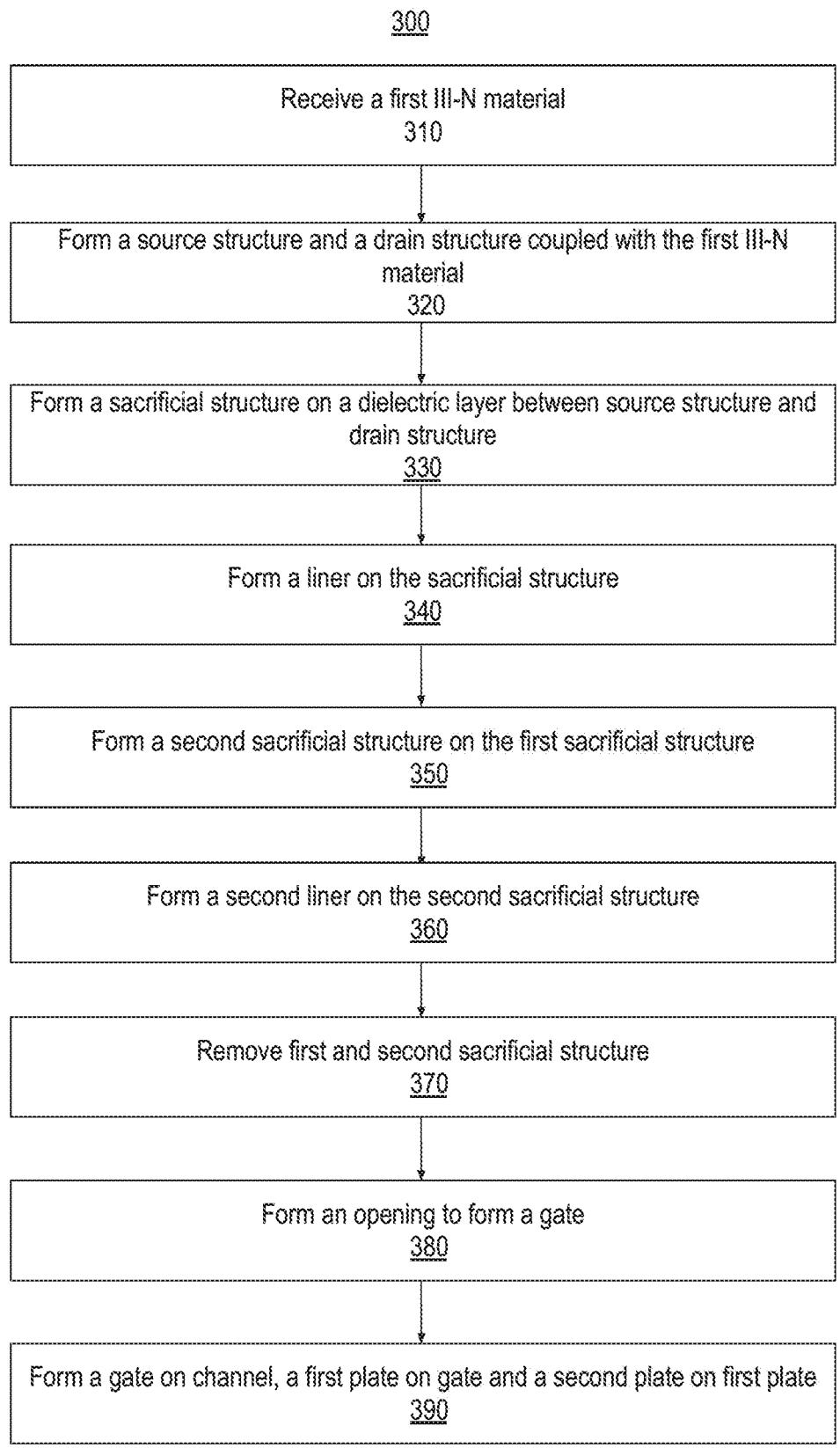
FIG. 3 is a flow diagram of a method to fabricate the III-N transistor in FIG. 1A, in accordance with embodiments of the present disclosure.

FIG. 3 is a flow diagram of a method 300 to fabricate the III-N transistor in FIG. 1A, in accordance with some embodiments of the present disclosure. In an embodiment, the method 300 begins in operation 310 by receiving a workpiece including a first III-N material. The method 300 continues in operation 320 by forming a source structure and a drain structure coupled to the first III-N material. The method 300 continues in operation 330 by forming a sacrificial structure over the first III-N material, and between the source and drain structures, where the sacrificial structure has a first lateral width. The method 300 continues in operation 340 by forming a first dielectric liner on the sacrificial structure and an isolation around the first dielectric liner. The method 300 continues in operation 350 by forming a second sacrificial structure having a second lateral width. The method 300 continues in operation 360 by forming a second dielectric liner on the second sacrificial structure and a second isolation around the second dielectric liner. The method 300 continues in operation 370 by removing the first and second sacrificial structures. The method 300 continues in operation 380 by forming a gate opening in a dielectric vertically between the first liner and the first III-N material. The method 300 continues in operation 390 by forming a gate in the gate opening and a first and second plate on the gate.

Figure 4A:
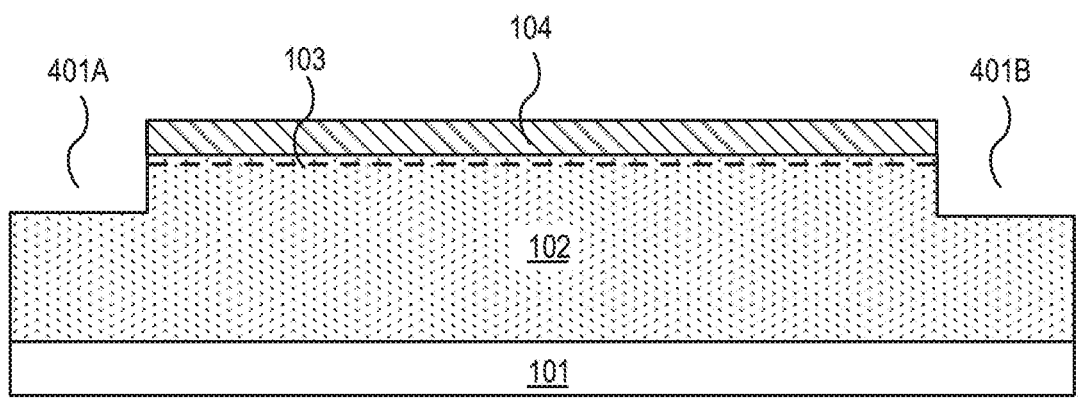
FIG. 4A illustrates a cross-sectional view of a patterned polarization layer on a patterned first III-N material, in accordance with an embodiment of the present disclosure.
Figure 4B:
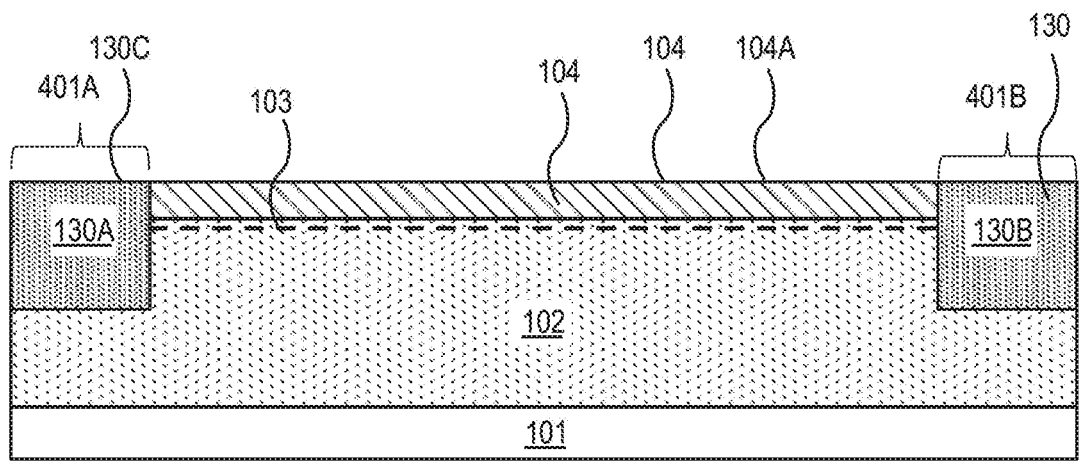
FIG. 4B illustrates the structure of FIG. 4A, following the formation of isolation structures in the polarization layer and in the III-N material.
Figure 4C:
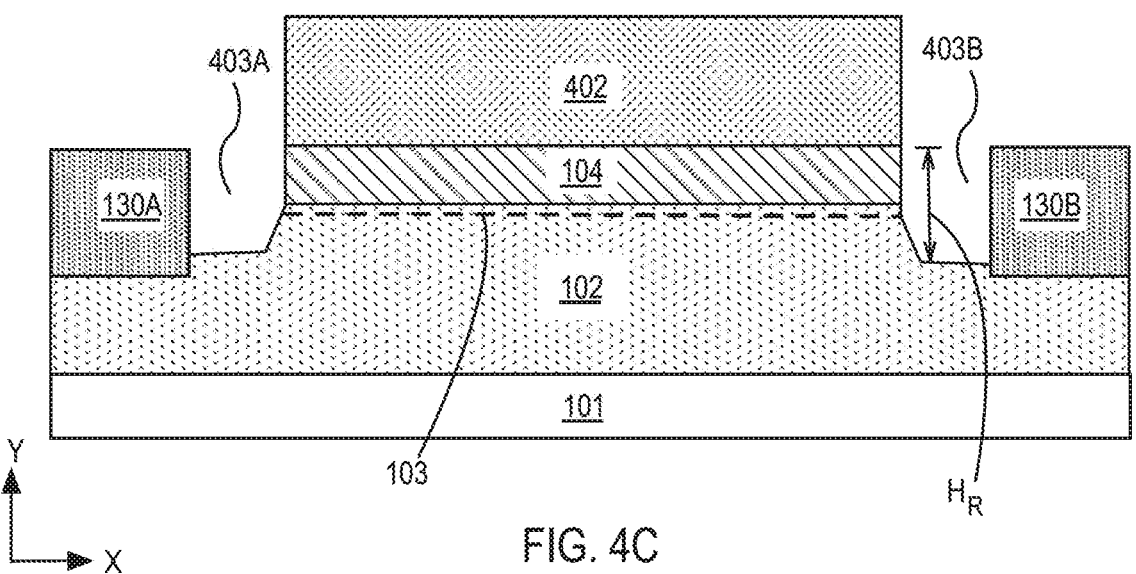
FIG. 4C illustrates the structure of FIG. 4B, following the formation of trenches in portions of the polarization charge inducing layer, and in portions of the III-N material adjacent to the isolation structures.
Figure 4D:
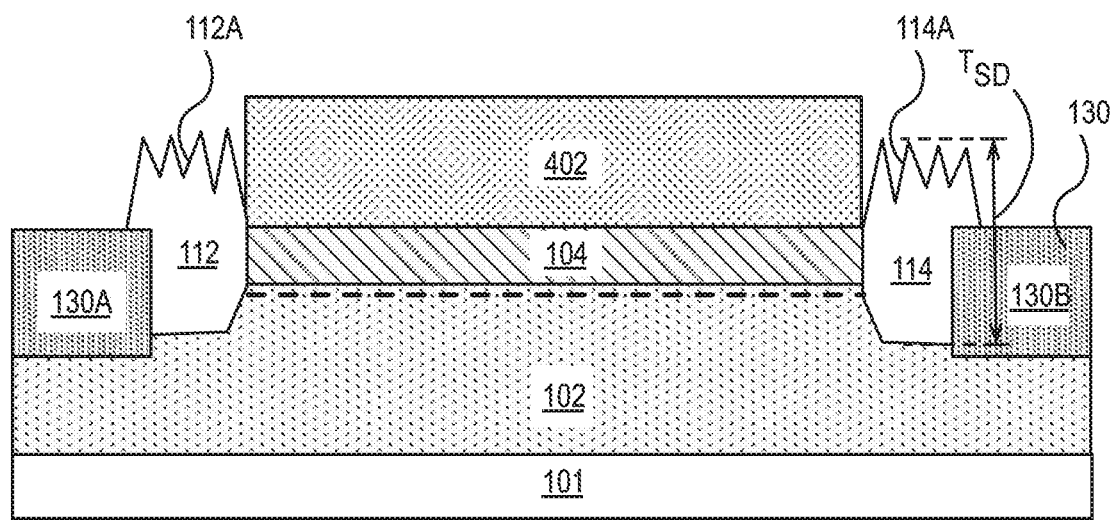
FIG. 4D illustrates the structure of FIG. 4C, following the formation of a drain structure and a source structure in the trenches.
Figure 4E:
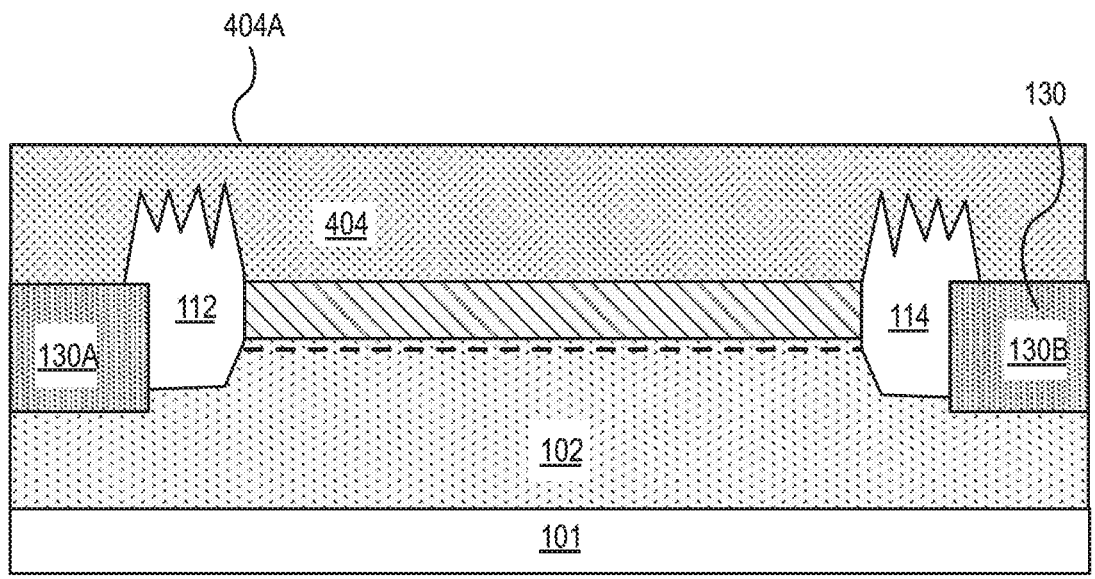
FIG. 4E illustrates the structure of FIG. 4D, following the removal of the mask and following the formation of a first dielectric material on the source structure and drain structure and on the polarization layer.
Figure 4F:
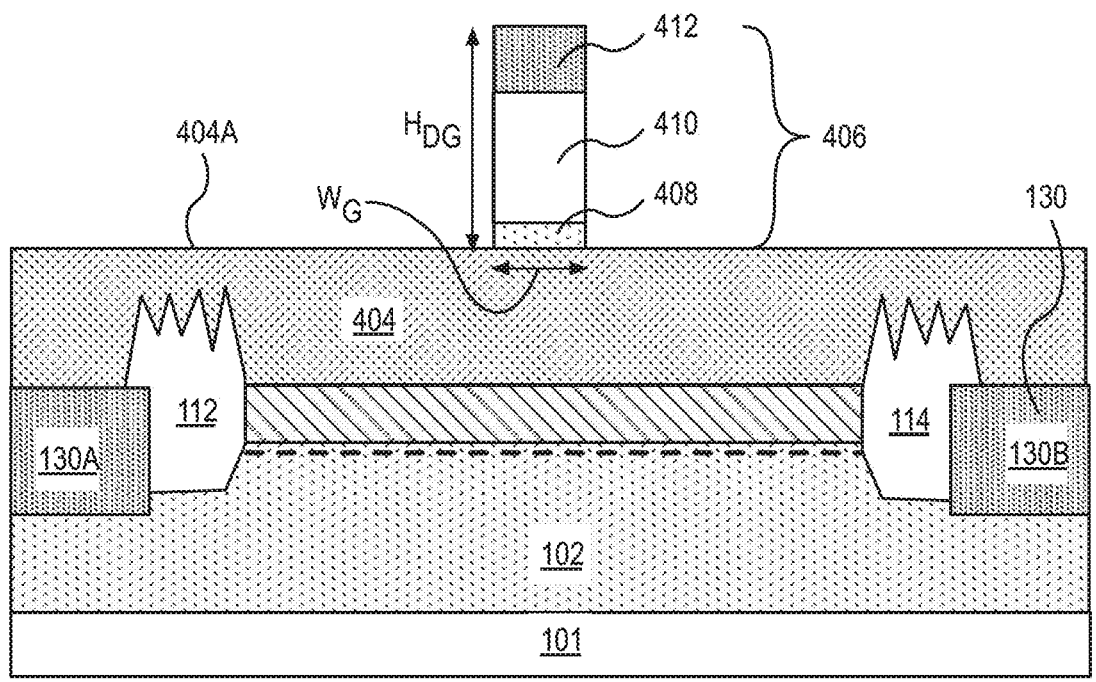
FIG. 4F illustrates the structure of FIG. 4E, following the formation of a dummy gate structure on the first dielectric material.
Figure 4G:
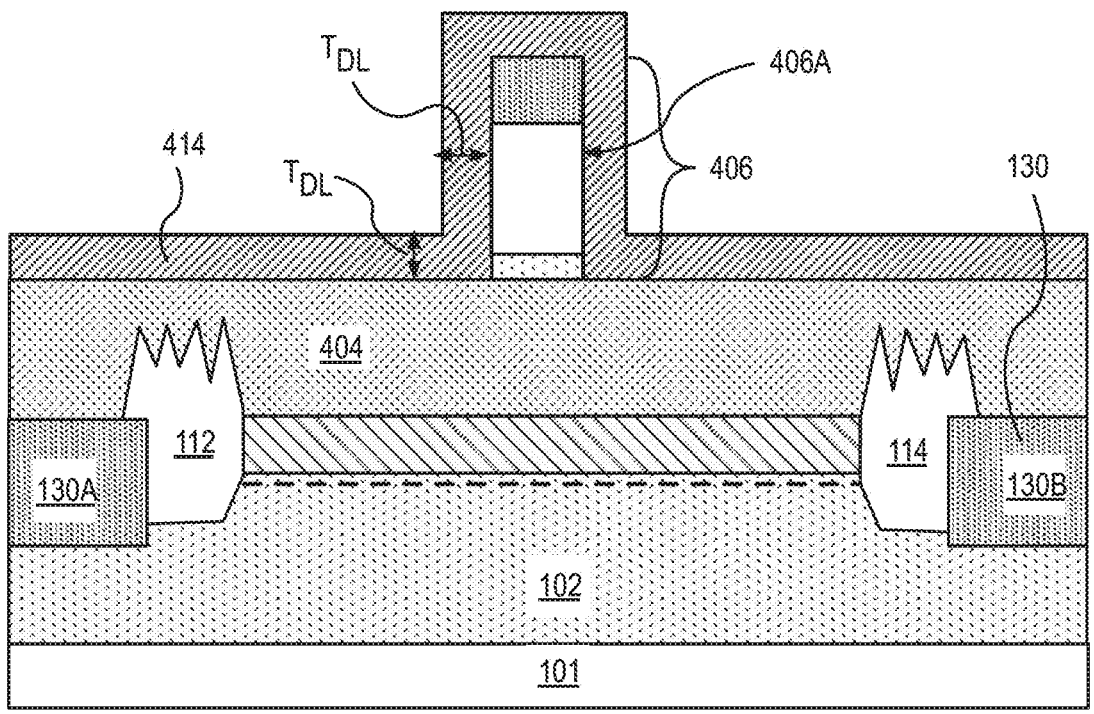
FIG. 4G illustrates the structure of FIG. 4F, following the formation of a dielectric liner on the dummy gate and on the first dielectric material.
Figure 4H:
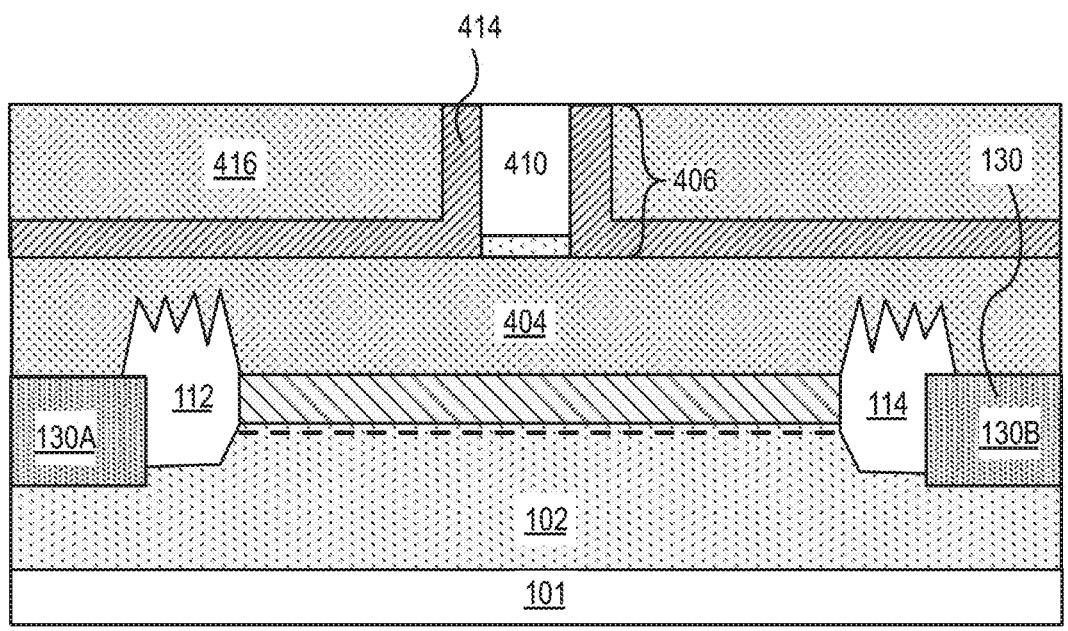
FIG. 4H illustrates the structure of FIG. 4G, following the formation of a second dielectric material on the dielectric liner, and following the planarization of the dielectric liner and top portion of the dummy gate structure.
Figure 4I:
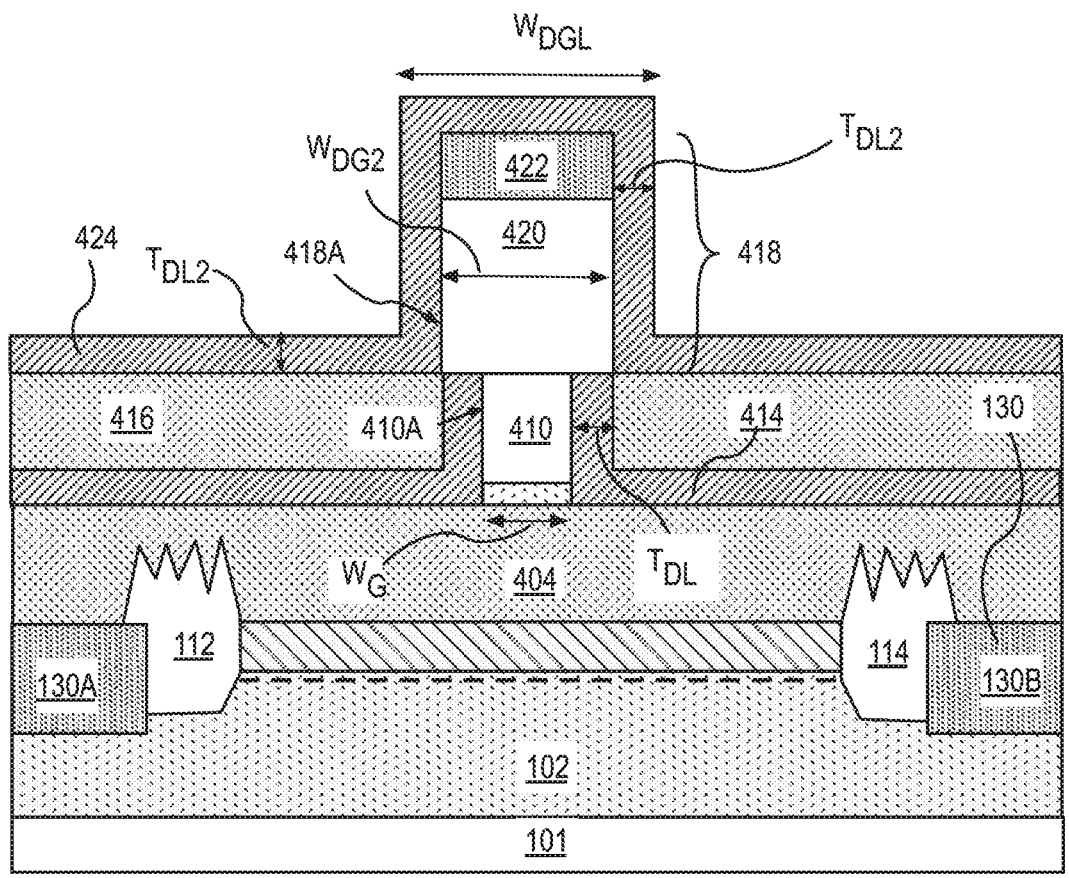
FIG. 4I illustrates the structure of FIG. 4H, following the formation of a second dummy gate structure, on the first dielectric liner and on the first dummy gate structure and formation of a second dielectric liner on the second dummy gate structure and on the second dielectric material.
Figure 4J:
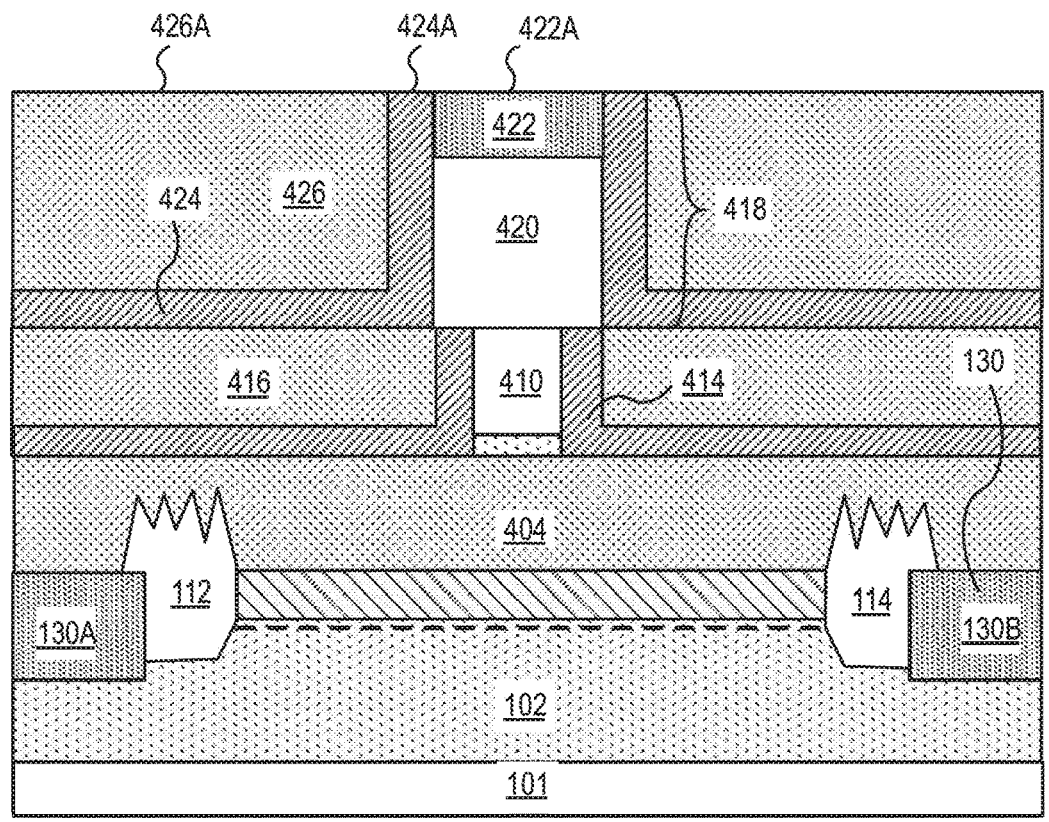
FIG. 4J illustrates the structure of FIG. 4I, following the formation of third dielectric material on the second dielectric liner and planarization of the third dielectric material and removal of portions of the second dielectric liner above the second dummy gate structure.
Figure 4K:
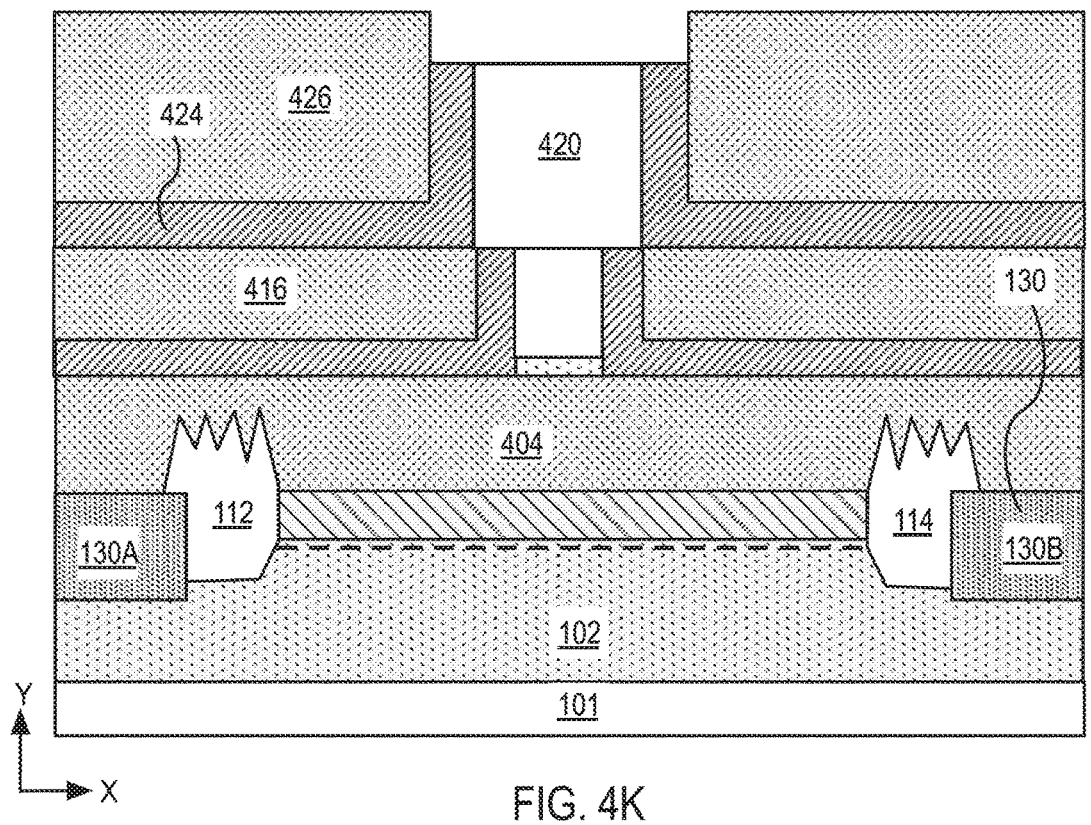
FIG. 4K illustrates the structure of FIG. 4J, following removal of a mask formed above the second dummy gate structure.
Figure 4L:
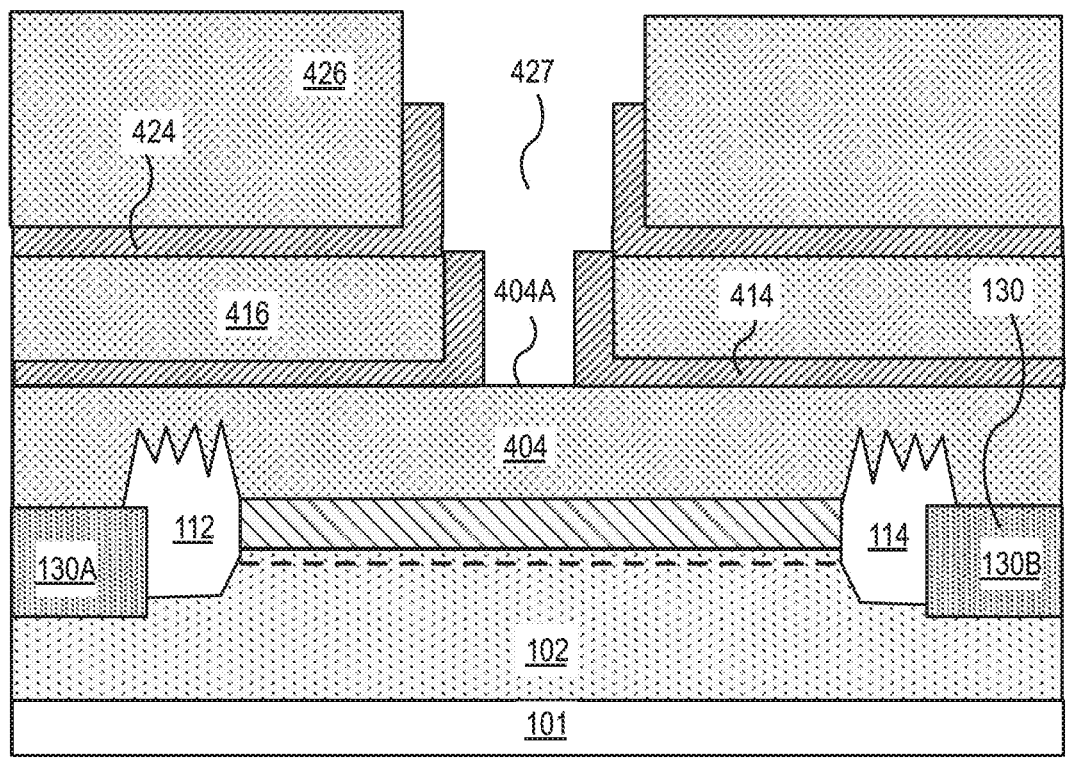
FIG. 4L illustrates the structure of FIG. 4K, following the removal of a second dummy body structure and a first dummy body structure, followed by removal of a dummy gate dielectric layer.
Figure 4M:
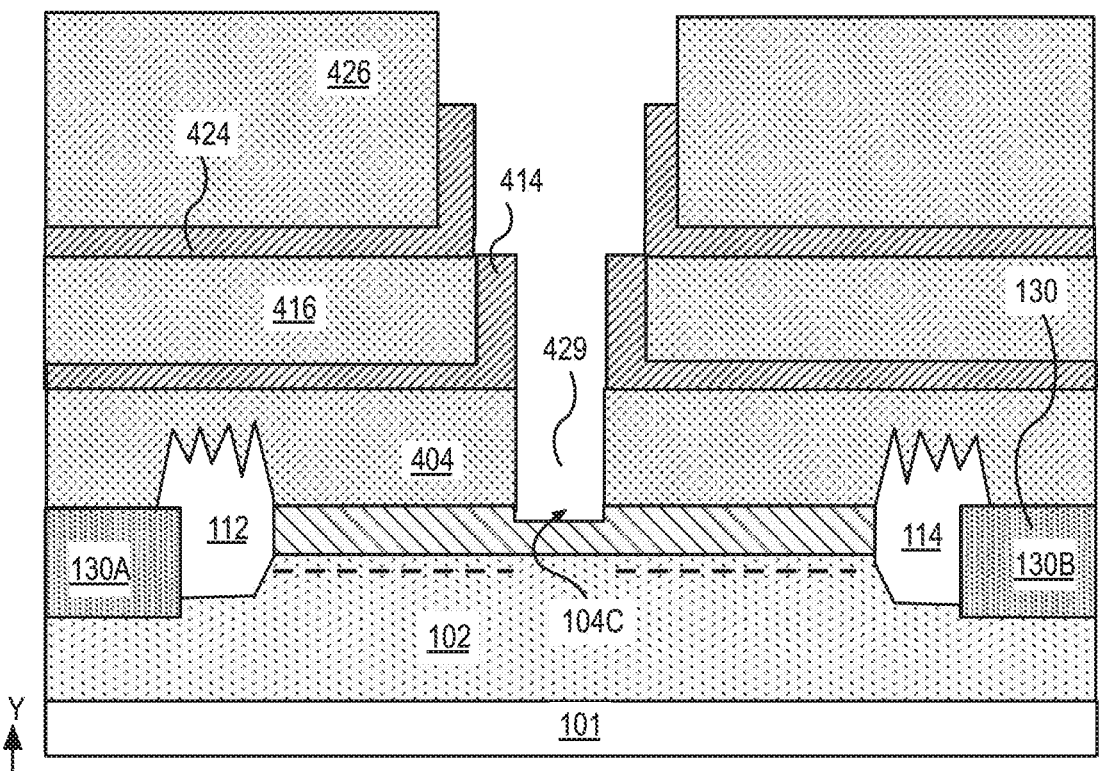
FIG. 4M illustrates the structure of FIG. 4L following the etching of the first dielectric material.
Figure 4N:
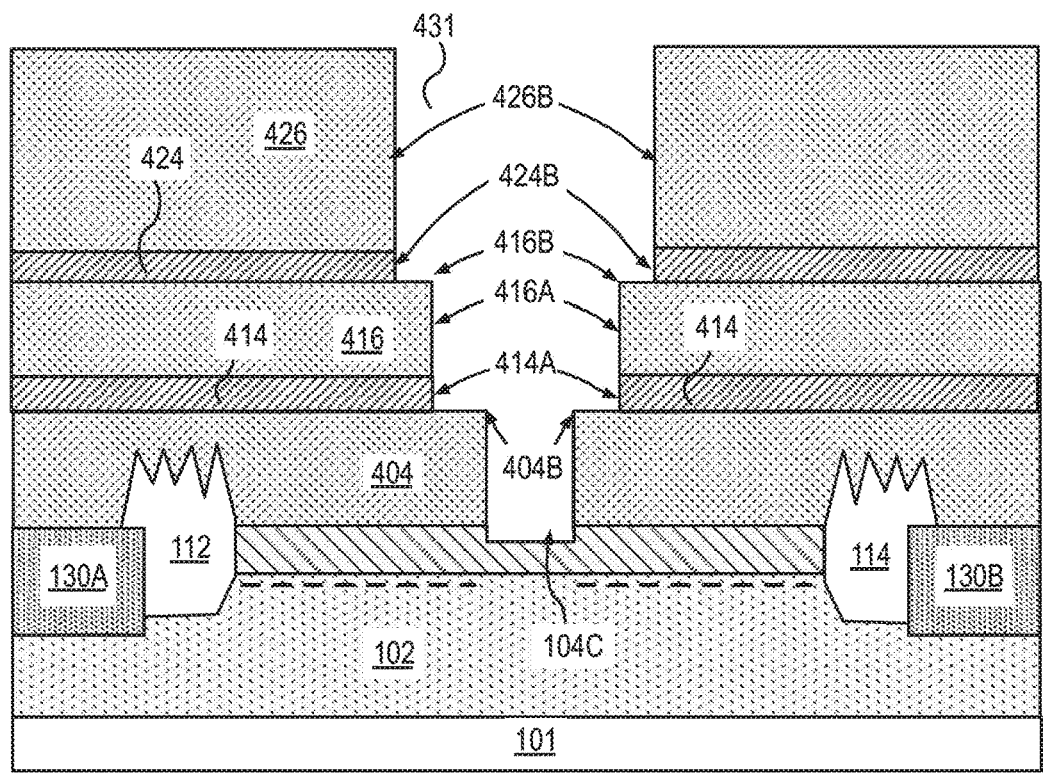
FIG. 4N illustrates the structure of FIG. 4M following the etching portions of the first and second dielectric liners.
Figure 4O:
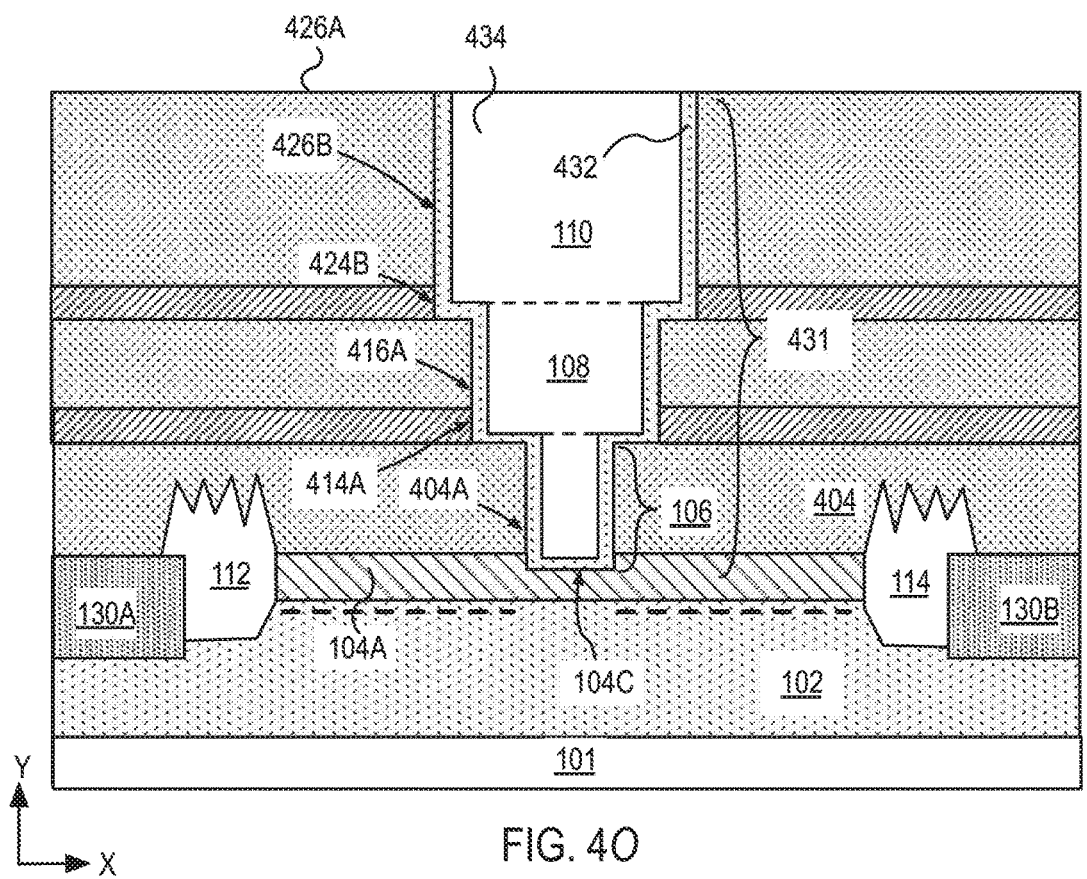
FIG. 4O illustrates the structure of FIG. 4N following the formation of a gate stack, a first plate on the gate stack and formation of a second plate on the first plate.

FIGS. 4A-4O illustrate cross sectional views of the III-N transistor structure 100 illustrated in FIG. 1 evolving as a fabrication method, such as method 300, is practiced.

FIG. 4A illustrates a cross-sectional view of a patterned polarization layer 104 on a channel layer 102, in accordance with an embodiment of the present disclosure. In an embodiment, the channel layer 102 is grown above the substrate 101 by a metal organic chemical vapor deposition (MOCVD) process. In some embodiments, the MOCVD process is carried out at a temperature in the range of 1000-1100 degrees Celsius. In an embodiment, the channel layer 102 includes GaN. In an embodiment, the GaN channel layer 102 is grown to a thickness that is approximately in the range of 100 nm-5 micrometers. The channel layer 102 may have a defect density less than (1e10/cm2) when grown to a sufficient thickness, such as a thickness of at least 100 nm.

In an embodiment, the polarization layer 104 is formed on channel layer 102. The polarization layer 104 may be formed using a MOCVD process and grown immediately after the growth of the III-N material of the channel layer 102. In an embodiment, the polarization layer 104 is grown by a MOCVD process. In some embodiments, the MOCVD process is carried out at a temperature in the range of 1000-1100 degrees Celsius. Depending on the embodiment, the polarization layer 104 includes a material such as, but not limited to AlN, AlInN or $Al_yGa_{1-y}N$ (where y is 0.24-0.36) and the III-N material includes a material such as but not limited to InGaN or GaN. The polarization layer 104 may be grown to a thickness between 3 nm and 20 nm. In an exemplary embodiment, the polarization layer 104 is AlInN. A polarization layer 104 having a thickness between 3 nm and 10 nm may induce strain in an uppermost surface of the channel layer 102. The presence of sufficient strain in channel layer 102 induces 2DEG (represented by dashed lines 105) in the strained region.

In an embodiment, a mask (not shown) is formed on the polarization layer 104. In one embodiment, a plasma etch process is utilized to etch the polarization layer 104 and the channel layer 102 through an exposed area in the mask to form one or more openings 401. In the illustrative embodiment, there are two openings 401A and 401B. The openings 401A and 401B may be sufficiently deep to provide isolation for source and drain trenches to be formed. In one embodiment, the openings 401A and 401B each have a depth between 75 nm and 200 nm.

FIG. 4B illustrates the structure of FIG. 4A, following the formation of isolation in the openings. In the illustrative embodiment, isolation 130A and 130B are formed in the openings 401A and 401B, respectively. In the illustrative embodiment, the isolation 130 is formed on the channel layer 102 and adjacent to the polarization layer 104. In an embodiment, a dielectric material is blanket deposited in the opening and on the polarization layer 104. Examples of the dielectric material may include any material that has a sufficient dielectric strength to provide electrical isolation such as, but not to, limited silicon dioxide, silicon nitride, silicon oxynitride, carbon doped nitride and carbon doped oxide. The dielectric material is subsequently planarized, for example using a chemical mechanical polish process. In the illustrative embodiment, the CMP process forms isolation 130A and 130B having uppermost surfaces 130C that are co-planar or substantially co-planar with an uppermost surface 104A of the polarization layer 104.

FIG. 4C illustrates the structure of FIG. 4B, following the formation of recess 403A and 403B in the polarization layer 104 and in the channel layer 102. In an embodiment, a mask 402 is formed on a portion of the polarization layer 104. In other embodiments, the mask 402 may also be formed over the isolation 130 (not illustrated). The mask 402 may include a material that can withstand high temperature processing such as a silicon oxide or a silicon nitride. A silicon oxide or a silicon nitride may be removed selectively with respect to the polarization layer 104 in a downstream operation. In an embodiment, a plasma etch process is utilized to etch unmasked portions of the polarization layer 104 and continued until a portion of the channel layer 102 is etched to form trenches 403A and 403B. The trenches 403A and 403B have a depth, $H_R$, that is measured with respect to the polarization layer surface 104A. In an embodiment, $H_R$, is between 30 nm and 100 nm.

FIG. 4D illustrates the structure of FIG. 4C, following the formation of a source structure 112 and drain structure 114 in the trenches 403A and 403B respectively. The source structure 112 and drain structure 114 may formed independently, for example, by masking one of the trenches 403A or 403B. In the illustrative embodiment, the source structure 112 and the drain structure 114 are grown at the same time. In an embodiment, source structure 112 and drain structure 114, are epitaxially grown sufficiently thick to fill trenches 403A and 403B respectively. In an embodiment, the source structure 112 and drain structure 114 are grown using a metal organic chemical vapor deposition MOCVD process. In the illustrative embodiment, the source structure 112 and drain structure 114 grow above the uppermost surface 104A of the polarization layer 104 and extend laterally onto portions of the isolation portions 130A and 130B respectively. In one such embodiment, the source structure 112 and drain structure 114 are referred to as raised source structure 112 and raised drain structure 114 respectively.

In an embodiment, an epitaxial growth process is utilized where the source structure 112 and drain structure 114 include III-N materials such as In, Ga and N. In some exemplary embodiments, the III-N materials includes In, Ga and N, where the atomic percent of indium is between 10-15 of the III-N materials. A 10-15 atomic percent indium concentration results in the formation of a source structure 112 and drain structure 114 that is polycrystalline. In some such embodiments, top surfaces 112A and 114A are non-planar and irregularly shaped. In other embodiments, by limiting the indium content to less than 3 atomic percent of the III-N materials including In, Ga and N, the source structure 112 or the drain structure 114 is formed to have a profile where the top surfaces 112A and 114A are predominantly flat, (not shown).

The source structure 112 and drain structure 114 may be doped for enhancing electrical conductivity. For example, the source structure 112 and drain structure 114 may include an n-type dopant. In an embodiment, the n-type dopants are introduced in-situ during the MOCVD growth process, where n-type dopant includes Si or Ge. In an embodiment, an n-type doped raised drain structure 114 and an n-type doped raised source structure 112 are epitaxially grown to a total thickness, $T_{SD}$, that is between 50 nm to 200 nm.

FIG. 4E illustrates the structure of FIG. 4D, following the removal of the mask 402 and following the formation of a dielectric material 404 on the source structure 112, on the drain structure 114 and on the polarization layer 104. In an embodiment, the dielectric material 404 includes a material that is the same or substantially the same as the dielectric material 116. The dielectric material 404 may be blanket deposited on the source structure 112 and drain structure 114 and on the polarization layer 104. In an embodiment, the dielectric material 404 is deposited using a PVD, or PECVD process. In an embodiment, the dielectric material 404 is subsequently planarized, for example using a chemical mechanical planarization (CMP) process and has a substantially flat uppermost surface 404A as shown.

FIG. 4F illustrates the structure of FIG. 4E, following the formation of a dummy gate structure 406 on the dielectric material surface 404A. In an embodiment, the dummy gate structure 406 includes a dummy gate dielectric layer 408, a dummy body structure 410 on the dummy gate dielectric layer 408, and a mask 412 on the dummy body structure 410. In an embodiment, the various layers of the dummy gate structure 406 are sequentially deposited. The dummy gate dielectric layer 408 may for example include a material such as silicon oxide or a silicon nitride. The dummy body structure 410 may include a material such as polysilicon, silicon germanium, silicon nitride or silicon dioxide. The mask 412 include a material such as silicon nitride, silicon oxynitride or a silicon carbide. The various layers of the dummy gate structure 406 are subsequently patterned by a plasma etch process to form the dummy gate structure 406 shown. The dummy gate structure 40 has a width, $W_G$, that may determine the width of a gate electrode to be subsequently formed in the dielectric material 404 below. The dummy gate structure 406 has a height, $H_{DG}$, as measured from surface 404A, that will determine an upper limit of the thickness of a first field plate, for e.g., field plate 108, to be formed.

FIG. 4G illustrates the structure of FIG. 4F, following the formation of a dielectric liner on the dummy gate structure 406 and on the dielectric material 404. The dielectric liner 414 may include a material such as the material of the dielectric liner 118. In an embodiment, the dielectric liner 414 has a thickness, $T_{DL}$, that is between 5 nm and 50 nm. As shown, the dielectric liner 414 also has a thickness, $T_{DL}$ on a sidewall 406A of the dummy gate structure 406. In other embodiments, the thickness, $T_{DL}$ on a sidewall 406A may be less than the thickness, $T_{DL}$ on the dielectric material 404.

The thickness, $T_{DL}$, may for example, determine a lateral distance a plate, such as the plate 108, extends from a sidewall of the gate electrode 106, as illustrated in FIG. 1A. The thickness, $T_{DL}$, may for example, also determine a lateral width of a plate, such as the plate 108.

FIG. 4H illustrates the structure of FIG. 4F, following the formation of a dielectric material 416 on the dielectric liner 414, and following the planarization of the dielectric liner 414 and a top portion of the dummy gate structure 406. In an embodiment, the dielectric material 416 includes a material that is the same or substantially the same as dielectric material 404. In another embodiment, the dielectric material 416 is different from the dielectric material 404. The planarization process may include a chemical mechanical polish process that removes the dielectric liner 414 from above the dummy gate structure 406. In the illustrative embodiment, the planarization process removes the mask 412 from the dummy gate structure 406 and exposes the dummy body structure 410.

FIG. 4I illustrates the structure of FIG. 4H, following the formation of a dummy gate structure 418, on the dielectric liner 414 and on the dummy body structure 410 and formation of a dielectric liner 424 on the dummy gate structure 418. In an embodiment, the dummy gate structure 418 includes a dummy body structure 420 and a mask 422. The dummy body structure 420 and the mask 422 may include a same material as the material of the dummy gate structure 406 and mask 412. The dummy gate structure 418 may be patterned in a same or similar manner as the dummy gate structure 406. The dummy gate structure 418 has a width, $W_{DG2}$. $W_{DG2}$ may be equivalent to a combined total lateral thickness, $W_G$ of the dummy body structure 410 and two times the thickness, $T_{DL}$ of the dielectric liner 414, as shown.

In other examples, dummy gate structure 418 has a width that is greater than a combined total thickness of the dummy body structure 410 and two times the thickness, $T_{DL}$ of the dielectric liner 414.

In an embodiment, the dielectric liner 424 is deposited on the dummy gate structure 418 and on the dielectric material 416 using a PVD, or PECVD or an ALD process. In the illustrative embodiment, dielectric liner 422 has thickness, $T_{DL2}$ on the surface of the dielectric material 416 and on the sidewall of the dummy gate structure 418. The dielectric liner 424 may include a same material as the material of the dielectric liner 414.

As shown the dummy gate structure 418 and the dielectric liner 424 have a combined lateral thickness, $W_{DGL}$. The combined lateral thickness, $W_{DGL}$ may determine a lateral thickness of a second plate, such as the plate 110 illustrated in FIG. 1A, to be formed in a subsequent processing operation. As such, the width, $W_{DG2}$ and thickness, $T_{DL2}$ may be each or combinedly utilize to determine a lateral thickness of a second plate to be formed.

For practicality, the thickness, $T_{DL2}$ may be modulated during fabrication rather than changing the width of the dummy gate structure 420. In some embodiments, $T_{DL2}$ is greater than $T_{DL1}$. For example, $T_{DL2}$ may be anywhere between 2.5-40 times greater than $T_{DL1}$.

In an embodiment, the dummy gate structure 418 are formed such that a sidewall 418A and sidewall 410A are aligned, and $T_{DL2}$ is at least as thick as $T_{DL}$. In some such embodiment, the resulting first and second plates and gate electrode to be formed will have a structure illustrated in FIG. 2B.

FIG. 4J illustrates the structure of FIG. 4I, following the formation of dielectric material 426 on the dielectric liner 424 and planarization of the dielectric material 426 and removal of portions of the dielectric liner 424 above the dummy gate structure 418. In an embodiment, the dielectric material 426 includes a material that is the same or substantially the same as the dielectric material 416. The dielectric material 426 may be formed by utilizing a process utilized to deposit dielectric material 416.

In an embodiment, a planarization process is utilized such as is described above. The planarization process removes a portion of the portions of the dielectric liner 424 above the dummy gate structure 418. The planarization process also removes a portion of the mask 422. In the illustrative embodiment, the planarization process forms co-planar or substantially co-planar uppermost surfaces 426A, 422A and 424A of the dielectric material 426, mask 422 and dielectric liner 424, respectively.

FIG. 4K illustrates the structure of FIG. 4J, following removal of the mask 422. In an embodiment, a plasma etch is utilized to remove the mask 422 selectively to the dummy body structure 420. When the dielectric liner 424 includes a material that is the same or substantially the same as the material of the mask 422, portions of the dielectric liner 424 directly in contact with the mask 422 are also etched as shown. In other embodiments, when the dielectric liner 424 includes a material that is different from the material of the mask 422, portions of the dielectric liner 424 directly in contact with the mask 422 are not etched, when the mask 422 is etched.

FIG. 4L illustrates the structure of FIG. 4K, following the removal of the dummy body structure 420 and a dummy body structure 410, followed by removal of the dummy gate dielectric layer 408 to form an opening 427. In an embodiment, the dummy body structure 420 and a dummy body structure 410 include polysilicon. A silicon dummy body structure 420 and a dummy body structure 410 may be removed selectively to the dielectric liners 424 and 414. The dummy gate dielectric layer 408 is removed, after removal of the dummy body structure 410, selectively to the dielectric liners 424 and 414. The uppermost surface 404A of the dielectric material 404 is exposed after removal of the dummy gate dielectric layer 408. Portions of the dielectric material 404 may be recessed during removal of the dummy gate dielectric layer 408, when the dummy gate dielectric layer 408 includes a material that is the same or substantially the same as the material of the dielectric material 404. In some embodiments, there is some recess under the dielectric liner 414.

FIG. 4M illustrates the structure of FIG. 4L following the etching of the dielectric material 404. In an embodiment, the dielectric material 404 is etched via a plasma etch process to form a gate opening 429. In the illustrative embodiment, a portion of the polarization layer 104 is also etched to form an enhancement mode transistor. Some top portions of the dielectric material 426 may be consumed during the plasma etch.

FIG. 4N illustrates the structure of FIG. 4L following the etching of portions of the dielectric liner 424 and portions of the dielectric liner 414 to form an opening 431. In an embodiment, a plasma etch is utilized to etch portions of the dielectric liner 424 and portions of the dielectric liner 414.

The plasma etch process is a line of sight process and removes portions of the dielectric liner 424 adjacent to dielectric material sidewalls 426B. Dielectric liner sidewalls 424B are formed as a result of the etch and are co-linear or substantially co-linear with the dielectric material sidewalls 426B, as shown. The plasma etch process also removes portions of the dielectric liner 414 adjacent to dielectric material sidewalls 416A. Dielectric liner sidewalls 414A are formed as a result of the etch and are co-linear or substantially co-linear with the dielectric material sidewalls 416A, as shown.

As shown the plasma etch process that removes the dielectric liners 414 and 424 are selective to the dielectric materials 416 and 404. Etch selectivity may enable formation of substantially well-defined and sharp corners portions 416B, and 404B as shown. In other embodiments, the corner portions 416B and 404B may have a curved profile.

FIG. 4O illustrates the structure of FIG. 4L following the formation of a gate electrode 106, a plate 108 on the gate electrode 106 and over portions of the dielectric material 404 and a plate 110 on the plate 108 and over portions of the dielectric material 416.

In an embodiment, a gate dielectric layer 107 is deposited into the opening 431 using an atomic layer deposition (ALD) or a PVD process. An atomic layer deposition process may conformally deposit the gate dielectric layer 107 in the opening 431. In other embodiments a physical vapor deposition process may be utilized. A PVD process does not conformally deposit the gate dielectric layer 107. Non conformality may not affect transistor performance as long as the portion of the gate dielectric layer 107 deposited in a lower surface of the recess 104C in the polarization layer 104 is substantially uniform in thickness.

In the illustrative embodiment, the gate dielectric material 107 is formed in the recess 104C of the polarization layer 104 and adjacent to dielectric material sidewall 404A. The gate dielectric material 107 is also formed adjacent to dielectric liner sidewall 414A, adjacent to dielectric material sidewall 416A, adjacent to dielectric liner sidewall 424A and adjacent to dielectric material sidewall 426B as shown.

The gate electrode material 434 is deposited in the opening 431 on the gate dielectric layer 107 to form a gate electrode 106 and plates 108 and 110 as shown. Portions of the gate dielectric layer 107 is also deposited on the dielectric material 426 and portions of the gate electrode material 432 is also deposited above the top surface 426A.

A planarization process is carried out after the deposition process, for example, using a CMP process. In an embodiment, the CMP process removes portions of the gate electrode material 432 and the gate dielectric layer 107 from above a level of the top surface 426A as shown.

Figure 5:
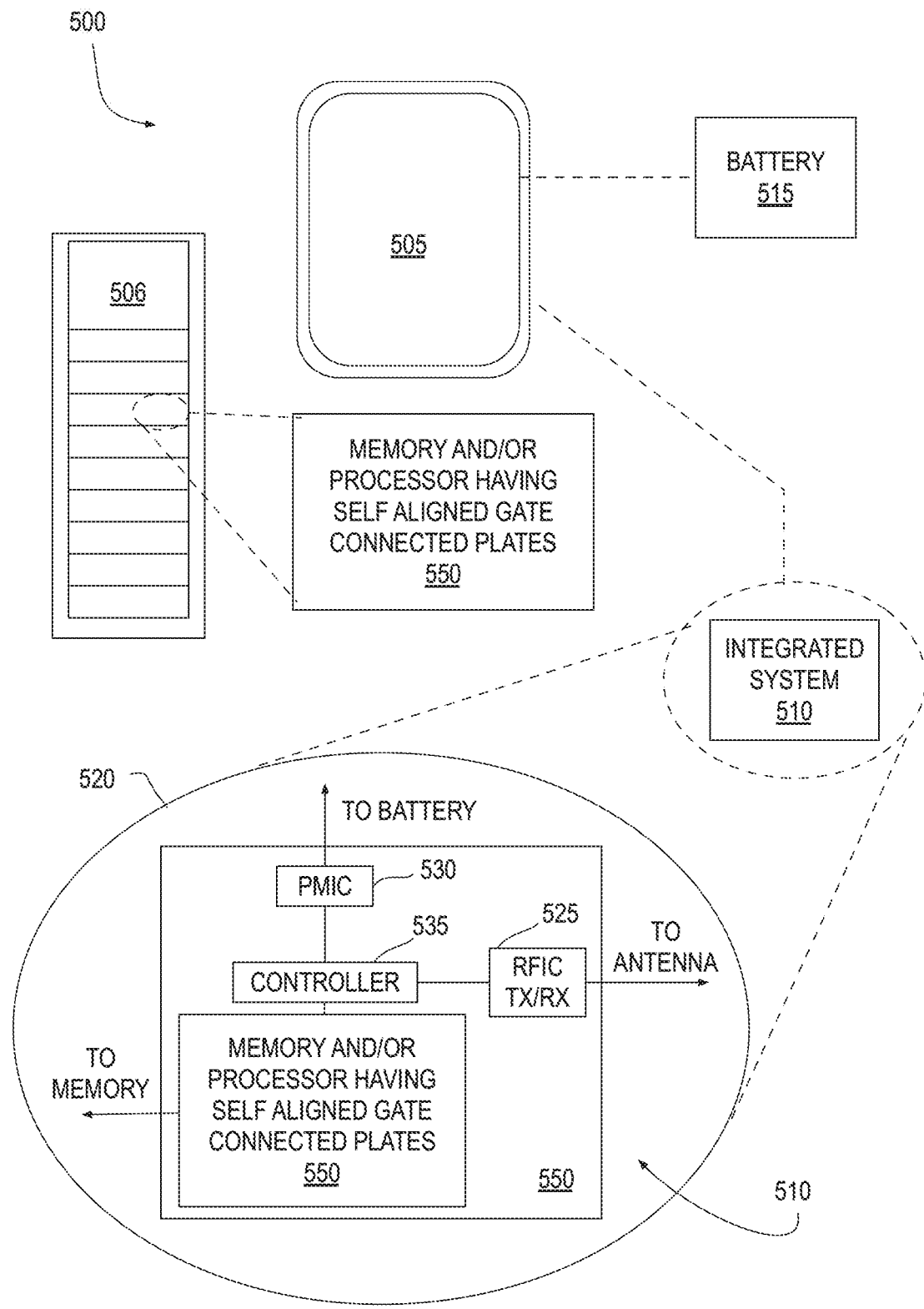
FIG. 5 is a functional block diagram of a III-N SoC including a III-N transistor of a mobile computing platform, in accordance with an embodiment of the present disclosure.

FIG. 5 illustrates a system 500 in which a mobile computing platform 505 and/or a data server machine 506 employs an integrated circuit (IC) 550 including a device having a including a transistor such as transistor structure 100, 200 or 250 as described above. The one or more transistor structures 100, 200 or 250 include a self-aligned gate connected plates. The server machine 506 may be any commercial server, for example including any number of high-performance computing platforms disposed within a rack and networked together for electronic data processing, which in the exemplary embodiment includes a packaged monolithic IC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone packaged chip within the server machine 506, packaged monolithic IC 550 includes a memory chip (e.g., RAM), or a processor chip (e.g., a microprocessor, a multi-core microprocessor, graphics processor, or the like) including at least one device system including a transistor such as transistor structure 100, 200 or 250 for example, as described above. The monolithic IC 550 may be further coupled to a board, a substrate, or an interposer 550 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front-end module further comprises a power amplifier on a transmit path and a low noise amplifier on a receive path), and a controller 535 thereof.

Functionally, PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.12 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 550 or within a single IC coupled to the package substrate of the monolithic IC 550.

Figure 6:
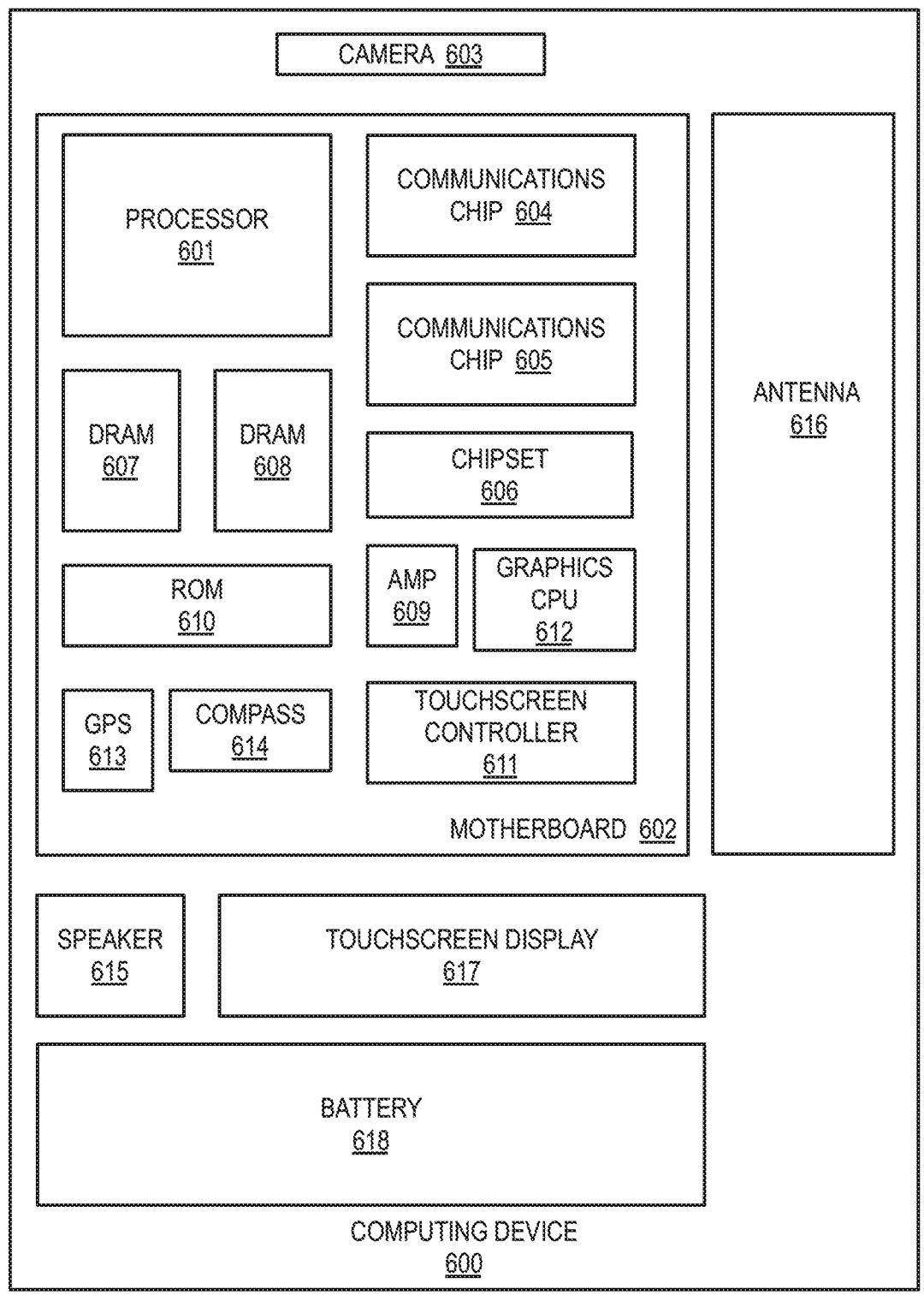
FIG. 6 illustrates a computing device in accordance with embodiments of the present disclosure.
Figure 7:
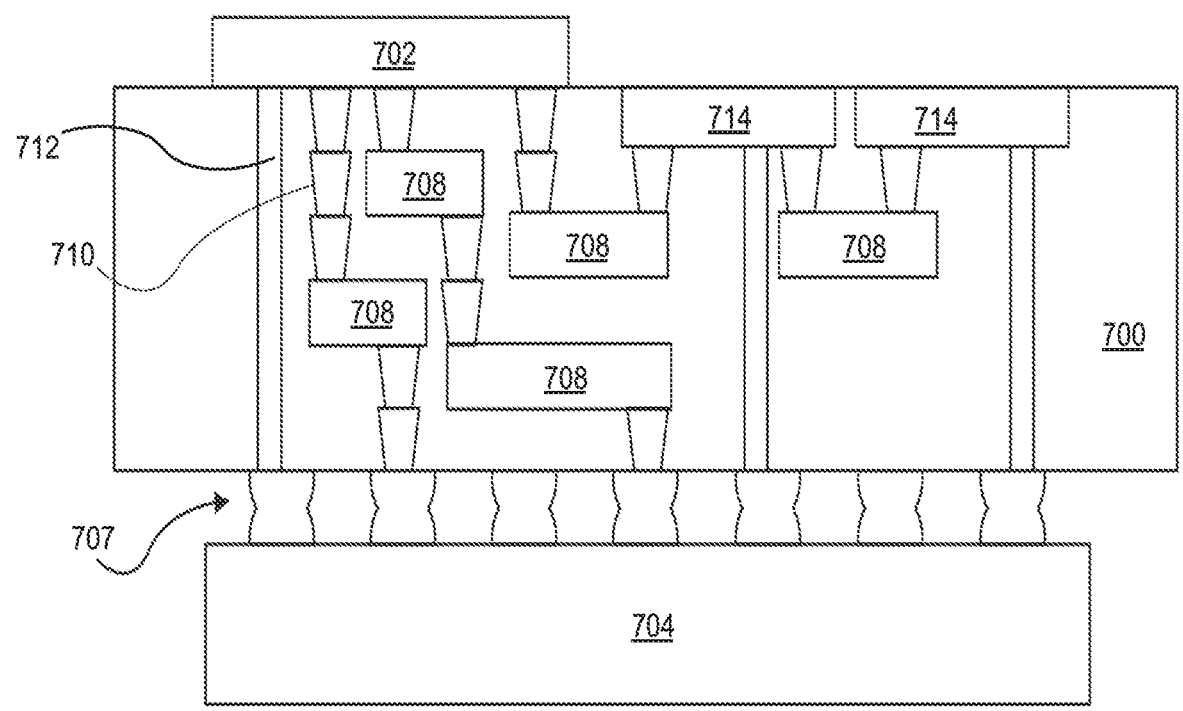
FIG. 7 illustrates an integrated circuit structure in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communications chip 605. Processor 601 is physically and electrically coupled to the motherboard 602. In some implementations, communications chip 605 is also physically and electrically coupled to motherboard 602. In further implementations, communications chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 605 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 604 and 605. For instance, a first communications chip 605 may be dedicated to shorter range wireless communications such as Wi-Fi and Bluetooth and a second communications chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes transistor such as transistor structure 100, 200 or 250, as described above. The term "processor" may refer to any device or portion of a device that processes electronic data from registers and/or memory to transform that electronic data into other electronic data that may be stored in registers and/or memory.

Communications chip 605 also includes an integrated circuit die packaged within communications chip 605. In another embodiment, the integrated circuit die of communications chip 605 includes a memory array with memory cells including a transistor such as transistor such as transistor structure 100, 200 or 250, as described above and a non-volatile memory device coupled to any of the transistor structure 100, 200 or 250. The non-volatile memory device may include a magnetic tunnel junction (MTJ) device, a resistive random-access memory (RRAM) device or a conductive bridge random access memory (CBRAM) device.

In various examples, one or more communication chips 604, 605 may also be physically and/or electrically coupled to the motherboard 602. In further implementations, communication chips 604 may be part of processor 601. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics CPU 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of memory cells and/or transistors such as III-N transistor 100, 200 and 250, as described above and built in accordance with embodiments of the present disclosure.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top b04, an entertainment control unit, a digital camera, a portable music player, or a digital video recorder. In further implementations, the computing device 600 may be any other electronic device that processes data.

FIG. 8 illustrates an integrated circuit structure 700 that includes one or more embodiments of the disclosure. The integrated circuit (IC) structure 700 is an intervening structure used to bridge a first substrate 702 to a second substrate 704. The first substrate 702 may be, for instance, an integrated circuit die. The second substrate 704 may be, for instance, a memory module, a computer mother, or another integrated circuit die. The integrated circuit die may include one or more device systems including one or more transistors such as transistor structure 100, 200 or 250, as described above, for example. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 707 that can subsequently be coupled to the second substrate 704. In some embodiments, the first substrate 702 and second substrate 704 are attached to opposing sides of the integrated circuit (IC) structure 700. In other embodiments, the first substrate 702 and second substrate 704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure 700 may be formed of alternate rigid or flexible materials that may include the same materials described above for use in a semiconductor substrate, such as silicon, germanium, and other group III-N, group III-V and group IV material.

The integrated circuit (IC) structure 700 may include metal interconnects 708 and via 710, including but not limited to through-silicon vias (TSVs) 712. The integrated circuit (IC) structure 700 may further include embedded devices 714, including both passive and active devices. Such devices include, but are not limited to, capacitors, decoupling capacitors, resistors, inductors, fuses, diodes, transformers, III-N transistors such as transistors 100A, 100B, 100C, 200A or 200B, as described above, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 700. In accordance with embodiments of the present disclosure, apparatuses or processes disclosed herein may be used in the fabrication of integrated circuit (IC) structure 700.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include III-N transistors with multi-tiered field plates and methods of fabrication. The following examples pertain to further embodiments.

In a first example, device includes a first Group III-Nitride (III-N) material, a gate electrode above the III-N material, the gate electrode having a first sidewall, a first plate on the gate electrode, the first plate having a second sidewall laterally beyond the first sidewall and above the III-N material by a first distance. The device further includes a second plate on the first plate, where the second plate has a third sidewall laterally beyond the second sidewall and above the III-N material by a second distance, greater than the first. A source structure and a drain structure are on opposite sides of the gate electrode, where the source and drain structures each include a second III-N material.

In second examples, for any of first examples, the gate electrode, the first plate and the second plate include a same material.

In third examples, for any of the first through second examples, the second sidewall is beyond the first sidewall by an amount between 5 nm and 200 nm.

In fourth examples, for any of the second examples, the third sidewall extends beyond the second sidewall by an amount between 5 nm and 500 nm.

In fifth examples, for any of the first through fourth examples, the first plate has a thickness between 10 nm and 100 nm and the second plate has a thickness between 10 nm and 100 nm and the gate electrode has a thickness between 10 nm and 100 nm.

In sixth examples, for any of the first through fifth examples, wherein the third sidewall is over at least one of the source or drain.

In seventh examples, for any of the first through sixth examples, the gate electrode has a first width within a cross-sectional plane that intersects the source and drain, the first plate has a second width within the cross-sectional plane and the second plate has a third width within the cross sectional plane, wherein the third width is greater than the second width and the second width is greater than the first width, and wherein the gate electrode, the first plate and the second plate are symmetrical about a center of the first width.

In eighth examples, for any of the first through seventh examples, the device further includes a dielectric liner adjacent the first plate having a thickness; and where two times the sum of the thickness of the dielectric liner plus the first width is equal to the second width.

In ninth examples, for any of the seventh examples, the gate electrode has a first width within a cross-sectional plane that intersects the source and drain, the first plate has a second width within the cross-sectional plane and the second plate has a third width within the cross sectional plane, where the third width is greater than the second width and the second width is greater than the first width, and where the gate electrode, the first plate are symmetrically arranged within the cross-sectional plane and where the second plate and the first plate are asymmetrically about a center of the first width.

In tenth examples, for any of the ninth examples, the gate electrode has a fourth sidewall opposite the first sidewall, and the first plate has a fifth sidewall opposite the second sidewall, and the second plate has a sixth sidewall opposite the third sidewall, wherein both the fifth sidewall and the sixth sidewall are laterally beyond the fourth sidewall by an equal amount.

In eleventh examples, for any of the first through tenth examples, the device further includes a gate dielectric between the gate electrode and the first III-N material.

In twelfth examples, for any of the first through eleventh examples, the gate dielectric layer is adjacent to and in contact with the first sidewall, adjacent to and in contact with the second sidewall and adjacent to and in contact with the third sidewall.

In thirteenth examples, a method of fabricating a device includes receiving a workpiece including a first III-Nitride (III-N) material and forming a source structure and a drain structure coupled to the first III-N material, the source and drain structures including a second III-N material. The method further includes forming a gate stack over the first III-N material, and between the source and drain structures in a first dielectric material, the gate stack having a first lateral width and forming a first plate on the gate stack by filling a first opening in a second dielectric material above the gate stack, where the first plate includes a conductor having a second lateral width, greater than the first lateral width. The method further includes forming a second plate on the first plate by expanding by filling a second opening in a third dielectric material formed above the first plate.

In a fourteenth example, for any of the thirteenth example, prior to forming the third opening the method further includes forming a dummy gate structure having the first lateral width above the first dielectric layer and forming a first dielectric liner having a fourth lateral width on a sidewall of the dummy gate and on the first dielectric material, where a sum of the first lateral width and two times the fourth lateral width is equal to the second lateral width.

The method further includes forming the second dielectric material adjacent to the first dielectric liner and forming a second dummy gate structure having a fifth lateral width above the first dummy gate structure. The method further includes forming a second dielectric liner having a sixth lateral width on a sidewall of the second dummy gate structure and on the second dielectric material, where a sum of the fifth lateral width and two times the sixth lateral width is equal to the third lateral width. The method further includes forming the third dielectric material adjacent to the second dielectric liner, removing the second dummy gate structure and the first dummy gate structure to expose the first dielectric material. The method further includes etching the first dielectric material above the first III-N material to form a fifth opening and etching the dielectric liner from the sidewall of the third dielectric material to form the second opening. The method further includes etching the dielectric liner from the sidewall of the second dielectric liner to form the first opening and forming the gate stack, the first plate and the second plate.

In a fifteenth example, for any of the fourteenth examples, forming the gate stack, the first plate and the second plate comprises depositing a gate dielectric layer in the fifth opening, in the second opening and in the first opening and a gate electrode layer on the gate dielectric layer.

In sixteenth examples, for any of the thirteenth through fifteenth examples, the second dummy gate structure has a fifth lateral width that is equal to the first lateral width of the first dummy gate structure and two times the sum of the fourth lateral width of the first dielectric liner.

In seventeenth examples, for any of the thirteenth through sixteenth examples, the second dummy gate structure has a first sidewall that is coplanar with a first sidewall of the first dummy gate structure, and wherein the second dielectric liner has a sixth lateral width that is at least equal to the fourth lateral width of the first dielectric liner, and wherein the fifth lateral width of the second dummy gate structure is greater than the first lateral width of the first dummy gate structure.

In eighteenth examples, for any of the thirteenth through seventeenth examples, wherein the second dielectric liner has a sixth lateral width that is greater than the fourth lateral width of the first dielectric liner.

In a nineteenth example, a system includes a processor and a radio transceiver coupled to the processor, wherein the transceiver includes a transistor. The transistor includes a first Group III-Nitride (III-N) material, a gate electrode above the III-N material, the gate electrode having a first sidewall, a first plate on the gate electrode, the first plate having a second sidewall laterally beyond the first sidewall and above the III-N material by a first distance. The device further includes a second plate on the first plate, where the second plate has a third sidewall laterally beyond the second sidewall and above the III-N material by a second distance, greater than the first. A source structure and a drain structure are on opposite sides of the gate electrode, where the source and drain structures each include a second III-N material.

In a twentieth example, for any of the nineteenth examples, the gate electrode has a first width within a cross-sectional plane that intersects the source and drain, the first field plate has a second width within the cross-sectional plane and the second field plate has a third width within the cross sectional plane, wherein the third width is greater than the second width and the second width is greater than the first width, and wherein the gate electrode, the first field plate and the second field plate are symmetrical about a center of the first width.

What is claimed is:

1. A device comprising:
  a first Group III-Nitride (III-N) material;
  a gate electrode above the first III-N material, the gate electrode comprising a first sidewall;
  a first plate on the gate electrode, the first plate comprising a second sidewall laterally beyond the first sidewall and above the III-N material by a first distance;
  a second plate on the first plate, the second plate comprising a third sidewall laterally beyond the second sidewall and above the III-N material by a second distance, greater than the first distance; and
  a source structure and a drain structure on opposite sides of the gate electrode, the source and drain structures each comprising a second III-N material.

2. The device of claim 1, wherein the gate electrode, the first plate, and the second plate comprise a same material.

3. The device of claim 1, wherein the second sidewall extends beyond the first sidewall by between 5 nm and 200 nm.

4. The device of claim 1, wherein the third sidewall extends beyond the second sidewall by between 5 nm and 500 nm.

5. The device of claim 1, wherein the first plate has a thickness between 10 nm and 100 nm, the second plate has a thickness between 10 nm and 100 nm, and the gate electrode has a thickness between 10 nm and 100 nm.

6. The device of claim 1, wherein the third sidewall is over at least one of the source structure or the drain structure.

7. The device of claim 1, wherein the gate electrode has a first width within a cross-sectional plane that intersects the source and drain, the first plate has a second width within the cross-sectional plane, and the second plate has a third width within the cross sectional plane, wherein the third width is greater than the second width and the second width is greater than the first width, and wherein the gate electrode, the first plate, and the second plate are symmetrical about a center of the first width.

8. The device of claim 7, further comprising:
  a dielectric liner adjacent the first plate, the dielectric liner having a thickness; and wherein a sum of the first width plus two times the sum of the thickness of the dielectric liner is equal to the second width.

9. The device of claim 1, wherein the gate electrode has a first width within a cross-sectional plane that intersects the source and drain, the first plate has a second width within the cross-sectional plane, and the second plate has a third width within the cross sectional plane, wherein the third width is greater than the second width and the second width is greater than the first width, wherein the gate electrode and the first plate are symmetrically arranged within the cross-sectional plane, and wherein the second plate and the first plate are asymmetrically arranged about a center of the first width.

10. The device of claim 1, wherein the gate electrode comprises a fourth sidewall opposite the first sidewall, the first plate comprises a fifth sidewall opposite the second sidewall, and the second plate comprises a sixth sidewall opposite the third sidewall, wherein both the fifth sidewall and the sixth sidewall are laterally beyond the fourth sidewall by an equal amount.

11. The device of claim 1, wherein the device further comprises a gate dielectric layer between the gate electrode and the first III-N material.

12. The device of claim 11, wherein the gate dielectric layer is adjacent to and in contact with each of the first sidewall, the second sidewall, and the third sidewall.

13. A system comprising:

a processor; and a radio transceiver coupled to the processor, wherein the transceiver comprises a transistor comprising:

a first Group III-Nitride (III-N) material;

a gate electrode above the first III-N material, the gate electrode comprising a first sidewall;

a first plate on the gate electrode, the first plate comprising a second sidewall laterally beyond the first sidewall and above the III-N material by a first distance;

a second plate on the first plate, the second plate comprising a third sidewall laterally beyond the second sidewall and above the III-N material by a second distance, greater than the first distance; and a source structure and a drain structure on opposite sides of the gate electrode, the source and drain structures each comprising a second III-N material.

14. The system of claim 13, wherein the gate electrode has a first width within a cross-sectional plane that intersects the source and drain, the first field plate has a second width within the cross-sectional plane, and the second field plate has a third width within the cross sectional plane, wherein the third width is greater than the second width and the second width is greater than the first width, and wherein the gate electrode, the first field plate, and the second field plate are symmetrical about a center of the first width.

15. The system of claim 14, wherein the transistor further comprises:

a dielectric liner adjacent the first plate, the dielectric liner having a thickness; and wherein a sum of the first width plus two times the sum of the thickness of the dielectric liner is equal to the second width.

16. The system of claim 13, wherein the gate electrode, the first plate, and the second plate comprise a same material.

17. The system of claim 13, wherein the second sidewall extends beyond the first sidewall by between 5 nm and 200 nm, the third sidewall extends beyond the second sidewall by between 5 nm and 500 nm, or the first plate has a thickness between 10 nm and 100 nm, the second plate has a thickness between 10 nm and 100 nm, and the gate electrode has a thickness between 10 nm and 100 nm.

18. The system of claim 13, wherein the gate electrode comprises a fourth sidewall opposite the first sidewall, the first plate comprises a fifth sidewall opposite the second sidewall, and the second plate comprises a sixth sidewall opposite the third sidewall, wherein both the fifth sidewall and the sixth sidewall are laterally beyond the fourth sidewall by an equal amount.

19. The system of claim 13, wherein the transistor further comprises a gate dielectric layer between the gate electrode and the first III-N material.

20. The system of claim 13, wherein the gate dielectric layer is adjacent to and in contact with each of the first sidewall, the second sidewall, and the third sidewall.

\* \* \* \* \*